US012578687B2

(12) United States Patent
Yamada

(10) Patent No.: US 12,578,687 B2
(45) Date of Patent: Mar. 17, 2026

(54) METHOD FOR PRODUCING ALKALI VAPOR CELL AND ALKALI VAPOR CELL

(71) Applicant: HAMAMATSU PHOTONICS K.K., Hamamatsu (JP)

(72) Inventor: Masaki Yamada, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 18/762,945

(22) Filed: Jul. 3, 2024

(65) Prior Publication Data

US 2026/0010122 A1 Jan. 8, 2026

(51) Int. Cl.
*G04F 5/14* (2006.01)
*H03B 17/00* (2006.01)
*H03L 7/26* (2006.01)

(52) U.S. Cl.
CPC .............. *G04F 5/14* (2013.01); *H03B 17/00* (2013.01); *H03L 7/26* (2013.01)

(58) Field of Classification Search
CPC ........... G04F 5/14; G04F 5/145; H03B 17/00; H03L 7/26
USPC ................................... 331/3, 94.1
See application file for complete search history.

(56) References Cited

U.S. PATENT DOCUMENTS

| | | | |
|---|---|---|---|
| 8,906,470 B2 | 12/2014 | Overstolz et al. | |
| 8,970,309 B2 | 3/2015 | Sato et al. | |
| 9,201,404 B2 * | 12/2015 | Harasaka | H03L 7/26 |
| 9,507,322 B2 * | 11/2016 | Hashi | G04F 5/145 |
| 10,033,394 B2 * | 7/2018 | Ishihara | H03L 7/26 |
| 10,859,981 B1 | 12/2020 | Ramirez-Serrano et al. | |
| 2008/0057619 A1 | 3/2008 | Youngner et al. | |
| 2023/0139149 A1 * | 5/2023 | Li | G04D 3/0069 264/279.1 |

OTHER PUBLICATIONS

Dyer, T. et al., "Micro-fabricated caesium vapor cell with 5mm optical path length," Journal of Applied Physics 132, 2022, pp. 204401-1-204401-5.
Kurashima, Yuichi et al., "An all-sapphire Cs gas cell for a chip-scale atomic clock," Japanese Journal of Applied Physics 58, 2019, pp. 096506-1-096506-7.
Liew, Li-Anne et al., "Microfabricated alkali atom vapor cells," Applied Physics Letters, vol. 84, No. 14, Apr. 5, 2004, pp. 2694-2696.
Liew, Li-Anne et al., "Wafer-level filling of microfabricated atomic vapor cells based on thin-film deposition and photolysis of cesium azide," Applied Physics Letters 90, Mar. 15, 2007, pp. 114106-1-114106-3.

* cited by examiner

*Primary Examiner* — Levi Gannon
(74) *Attorney, Agent, or Firm* — Faegre Drinker Biddle & Reath LLP

(57) ABSTRACT

A method for producing an alkali vapor cell includes a step of preparing a first member and a second member; a step of forming a first metal film on a surface of the first member; a step of forming a second metal film on a surface of the second member; a step of disposing a simple substance of the alkali metal; and a step of directly bonding the first metal film and the second metal film to each other in a normal temperature environment, in which in the step of forming the first metal film, the first metal film is formed so that a thickness of the first metal film is 100 nm or less, and in the step of forming the second metal film, the second metal film is formed so that a thickness of the second metal film is 100 nm or less.

14 Claims, 12 Drawing Sheets

*Fig.9*

| THICKNESS (nm) | SURFACE ROUGHNESS Ra(nm) | BONDING |
|---|---|---|
| 0 | 0.7 | - |
| 6.3 | 0.7 | A |
| 10.3 | 0.8 | A |
| 31 | 0.8 | A |
| 49.4 | 1.1 | A |
| 102.9 | 1.6 | A |
| 179.1 | 4.86 | B |
| 280.4 | 6.1 | B |

*Fig.12*

METHOD FOR PRODUCING ALKALI VAPOR CELL AND ALKALI VAPOR CELL

TECHNICAL FIELD

One aspect of the present disclosure relates to a method for producing an alkali vapor cell and an alkali vapor cell.

BACKGROUND

An atomic oscillator is known which includes an alkali vapor cell in which an alkali metal is enclosed, a light source for illuminating a laser beam to the alkali vapor cell, and a photodetector for detecting light that has passed through the alkali vapor cell (for example, the specification of U.S. Pat. No. 8,970,309).

In the production process of an alkali vapor cell used in such an atomic oscillator, the pressure of gas enclosed in the alkali vapor cell may fluctuate from a target value due to temperature changes or the like. Such fluctuations in gas pressure may reduce the efficiency of measurement using the alkali vapor cell. For example, the transition frequency shift of an atomic clock using an atomic oscillator depends on the gas pressure in the alkali vapor cell. Therefore, in a case where the actual gas pressure in the produced alkali vapor cell greatly fluctuates from an assumed value, it may be necessary to search the transition frequency in a wide frequency range, which reduces the efficiency of measurement using the alkali vapor cell.

An object of one aspect of the present disclosure is to provide a method for producing an alkali vapor cell with which efficient measurement can be made, and the alkali vapor cell.

SUMMARY

A method for producing an alkali vapor cell according to an aspect of the present disclosure is [1] "a method for producing an alkali vapor cell including a step of preparing a first member and a second member constituting at least a part of a container for enclosing an alkali metal; a step of forming a first metal film on a surface of the first member; a step of forming a second metal film on a surface of the second member; a step of disposing a simple substance of the alkali metal on at least a partial region of the surface of the first member and the surface of the second member; and a step of directly bonding the first metal film and the second metal film to each other in a normal temperature environment, in which in the step of forming the first metal film, the first metal film is formed so that a thickness of the first metal film is 100 nm or less, and in the step of forming the second metal film, the second metal film is formed so that a thickness of the second metal film is 100 nm or less".

In the method for producing an alkali vapor cell according to [1] described above, the first metal film and the second metal film are formed so that the thickness of each of the first metal film and the second metal film is 100 nm or less. As a result, the surface roughness of the first metal film and the second metal film is reduced, so that the first metal film and the second metal film can be directly bonded to each other in a normal temperature environment. That is, in the production method, heating is not required when the first metal film and the second metal film are bonded together, which can reduce the fluctuations in gas pressure in the alkali vapor cell. Further, in the method for producing an alkali vapor cell, a simple substance of an alkali metal is disposed. Accordingly, the fluctuations in gas pressure in the alkali vapor cell can be reduced as compared with a case where a compound of an alkali metal (for example, an azide) is decomposed in the alkali vapor cell to obtain a simple substance of an alkali metal. Therefore, according to the method for producing an alkali vapor cell according to [1] described above, it is possible to produce an alkali vapor cell with which efficient measurement can be made.

A method for producing an alkali vapor cell according to an aspect of the present disclosure may be [2] "the method for producing an alkali vapor cell according to [1], in which in the step of forming the first metal film, the first metal film is formed in a frame shape, in the step of forming the second metal film, the second metal film is formed in a frame shape, and in the step of disposing the simple substance of the alkali metal, the simple substance of the alkali metal is disposed on at least one of a first region located inside the first metal film on the surface of the first member and a second region located inside the second metal film on the surface of the second member". According to the method for producing an alkali vapor cell according to [2] described above, it is possible to sufficiently leave a region in which to dispose the simple substance of the alkali metal on the surface of the first member and the surface of the second member.

A method for producing an alkali vapor cell according to an aspect of the present disclosure may be [3] "the method for producing an alkali vapor cell according to [1] or [2] described above, in which in the step of forming the first metal film, the first metal film is formed of gold, and in the step of forming the second metal film, the second metal film is formed of gold". According to the method for producing an alkali vapor cell according to [3] described above, the oxidization of the first metal film and the second metal film can be suppressed.

A method for producing an alkali vapor cell according to an aspect of the present disclosure may be [4] "the method for producing an alkali vapor cell according to any one of [1] to [3] described above, in which the step of disposing the simple substance of the alkali metal includes at least one of a step of disposing the simple substance of the alkali metal on at least a partial region of the surface of the first member in a state where the first metal film is covered with a first mask, and a step of disposing the simple substance of the alkali metal on at least a partial region of the surface of the second member in a state where the second metal film is covered with a second mask". According to the method for producing an alkali vapor cell according to [4] described above, it is possible to suppress the alkali metal from adhering to the surfaces of the first metal film and the second metal film when the simple substance of the alkali metal is disposed.

A method for producing an alkali vapor cell according to an aspect of the present disclosure may be [5] "the method for producing an alkali vapor cell according to [4], in which each of the first mask and the second mask is formed of a metal and has a thickness of 0.5 mm or more and 1 mm or less". According to the method for producing an alkali vapor cell according to [5] described above, since the first mask and the second mask have a certain degree of mechanical strength, the first metal film and the second metal film can be appropriately covered with the first mask and the second mask.

A method for producing an alkali vapor cell according to an aspect of the present disclosure may be [6] "the method for producing an alkali vapor cell according to any one of [1] to [5] described above, in which in the step of forming the first metal film, a first layer is formed of chromium on the surface of the first member, a second layer is formed of platinum or nickel on the first layer, and the first metal film is formed on the second layer". According to the method for producing an alkali vapor cell according to [6] described above, since the first layer formed of chromium adheres to the surface of the first member, it is possible to suppress the first metal film from being peeled off from the surface of the first member. The second layer formed of platinum can suppress alloying between the material of the first layer and the material of the first metal film.

A method for producing an alkali vapor cell according to an aspect of the present disclosure may be [7] "the method for producing an alkali vapor cell according to any one of [1] to [6] described above, in which in the step of forming the second metal film, a third layer is formed of chromium on the surface of the second member, a fourth layer is formed of platinum or nickel on the third layer, and the second metal film is formed on the fourth layer". According to the method for producing an alkali vapor cell according to [7] described above, since the third layer formed of chromium adheres to the surface of the second member, it is possible to suppress the second metal film from being peeled off from the surface of the second member". The fourth layer formed of platinum can suppress alloying between the material of the third layer and the material of the second metal film.

A method for producing an alkali vapor cell according to an aspect of the present disclosure may be [8] "the method for producing an alkali vapor cell according to any one of [1] to [7] described above, further including a step of cleaning a surface of the first metal film by plasma treatment". According to the method for producing an alkali vapor cell according to [8] described above, the first metal film can be appropriately bonded to the second metal film.

A method for producing an alkali vapor cell according to an aspect of the present disclosure may be [9] "the method for producing an alkali vapor cell according to any one of [1] to [8] described above, further including a step of cleaning a surface of the second metal film by plasma treatment". According to the method for producing an alkali vapor cell according to [9] described above, the second metal film can be appropriately bonded to the first metal film.

A method for producing an alkali vapor cell according to an aspect of the present disclosure may be "the method for producing an alkali vapor cell according to any one of [1] to [9] described above, in which in the step of forming the first metal film, the first metal film is formed so that surface roughness of the first metal film is 1.5 nm or less". According to the method for producing an alkali vapor cell according to [10] described above, the surface roughness of the first metal film is reduced, so that the first metal film and the second metal film can be directly bonded together more reliably in a normal temperature environment.

A method for producing an alkali vapor cell according to an aspect of the present disclosure may be [11] "the method for producing an alkali vapor cell according to any one of [1] to [10] described above, in which in the step of forming the second metal film, the second metal film is formed so that surface roughness of the second metal film is 1.5 nm or less". According to the method for producing an alkali vapor cell according to [11] described above, the surface roughness of the second metal film is reduced, so that the first metal film and the second metal film can be directly bonded together more reliably in a normal temperature environment.

A method for producing an alkali vapor cell according to an aspect of the present disclosure may be [12] "the method for producing an alkali vapor cell according to any one of [1] to [11] described above, in which in the step of directly bonding the first metal film and the second metal film to each other, the first metal film and the second metal film are directly bonded to each other in a state where pressure in a direction to bring the first member and the second member close to each other is applied to the first member and the second member". According to the method for producing an alkali vapor cell according to [12] described above, the first metal film and the second metal film can be bonded together more reliably.

A method for producing an alkali vapor cell according to an aspect of the present disclosure may be [13] "the method for producing an alkali vapor cell according to any one of [1] to [12] described above, in which the first member includes a first substrate portion having optical transparency and a frame portion that is formed on a main surface of the first substrate portion and surrounds a space on the main surface, the second member includes a second substrate portion having optical transparency, in the step of forming the first metal film, the first metal film is formed on a surface of the frame portion, in the step of forming the second metal film, the second metal film is formed on a main surface of the second substrate portion, and in the step of directly bonding the first metal film and the second metal film to each other, the second member is disposed on the frame portion, and the first metal film and the second metal film are directly bonded to each other so as to hermetically seal the space". According to the method for producing an alkali vapor cell according to [13] described above, a space in which the alkali metal is enclosed can be appropriately formed in the alkali vapor cell.

A method for producing an alkali vapor cell according to an aspect of the present disclosure is [14] "a method for producing an alkali vapor cell including a step of preparing a first member and a second member constituting at least a part of a container for enclosing an alkali metal; a step of forming a first metal film on a surface of the first member; a step of forming a second metal film on a surface of the second member; a step of disposing a simple substance of the alkali metal on at least a partial region of the surface of the first member and the surface of the second member; and a step of directly bonding the first metal film and the second metal film to each other in a normal temperature environment, in which in the step of forming the first metal film, the first metal film is formed so that surface roughness of the first metal film is 1.5 nm or less, and in the step of forming the second metal film, the second metal film is formed so that surface roughness of the second metal film is 1.5 nm or less".

In the method for producing an alkali vapor cell according to [14] described above, the first metal film and the second metal film are formed so that the surface roughness of each of the first metal film and the second metal film is 1.5 nm or less. As a result, the surface roughness of the first metal film and the second metal film is reduced, so that the first metal film and the second metal film can be directly bonded to each other in a normal temperature environment. That is, in the production method, heating is not required when the first metal film and the second metal film are bonded together, which can reduce the fluctuations in gas pressure in the alkali vapor cell. Further, in the method for producing an alkali vapor cell, a simple substance of an alkali metal is disposed. Accordingly, the fluctuations in gas pressure in the alkali vapor cell can be reduced as compared with a case where a compound of an alkali metal (for example, an azide) is decomposed in the alkali vapor cell to obtain a simple substance of an alkali metal. Therefore, according to the method for producing an alkali vapor cell according to [14] described above, it is possible to produce an alkali vapor cell with which efficient measurement can be made.

A method for producing an alkali vapor cell according to an aspect of the present disclosure may be [15] "the method for producing an alkali vapor cell according to according to [14], in which in the step of forming the first metal film, the first metal film is formed in a frame shape, in the step of forming the second metal film, the second metal film is formed in a frame shape, and in the step of disposing the simple substance of the alkali metal, the simple substance of the alkali metal is disposed on at least one of a first region located inside the first metal film on the surface of the first member and a second region located inside the second metal film on the surface of the second member". According to the method for producing an alkali vapor cell according to [15] described above, it is possible to sufficiently leave a region in which to dispose the simple substance of the alkali metal on the surface of the first member and the surface of the second member.

An alkali vapor cell according to one aspect of the present disclosure is [16] "an alkali vapor cell including a first member and a second member constituting at least a part of a container for enclosing an alkali metal; a first metal film formed on a surface of the first member; a second metal film formed on a surface of the second member; and a simple substance of the alkali metal disposed on at least a partial region of the surface of the first member and the surface of the second member, in which a thickness of each of the first metal film and the second metal film is 100 nm or less, and the first metal film and the second metal film are directly bonded to each other.

In the alkali vapor cell according to [16] described above, the first metal film and the second metal film each have a thickness of 100 nm or less and the surface roughness of the first metal film and the second metal film is reduced. Therefore, in the production process of the alkali vapor cell, the first metal film and the second metal film can be directly bonded to each other in a normal temperature environment. That is, heating is not required in order to bond the first metal film and the second metal film together, which can reduce the fluctuations in gas pressure in the alkali vapor cell. In the alkali vapor cell according to [16] described above, the simple substance of the alkali metal is disposed. In a case where a compound of the alkali metal (for example, an azide) is disposed, it is necessary to decompose the compound in order to obtain a simple substance of the alkali metal. However, in the alkali vapor cell according to [16] described above, such a decomposition treatment is unnecessary, which can reduce the fluctuations in gas pressure in the alkali vapor cell. Therefore, according to the alkali vapor cell described in [16] above, measurement can be efficiently made.

An alkali vapor cell according to one aspect of the present disclosure may be [17] "the alkali vapor cell according to [16] described above, in which the first metal film is formed in a frame shape on the surface of the first member, the second metal film is formed in a frame shape on the surface of the second member, and the simple substance of the alkali metal is disposed on at least one of a first region located inside the first metal film on the surface of the first member and a second region located inside the second metal film on the surface of the second member. According to the alkali vapor cell described in [17] above, it is possible to sufficiently leave a region in which to dispose the simple substance of the alkali metal on the surface of the first member and the surface of the second member.

6

According to one aspect of the present disclosure, it is possible to provide a method for producing an alkali vapor cell with which efficient measurement can be made, and the alkali vapor cell.

BRIEF DESCRIPTION OF THE DRAWINGS

FIG. 9 is a table showing measured values of the thickness and surface roughness of the first metal film, and the possibility of direct bonding between the first metal film and a second metal film in a normal temperature environment;

FIG. 12 is a cross-sectional view of an alkali vapor cell according to a third embodiment.

DETAILED DESCRIPTION

Figure 1:
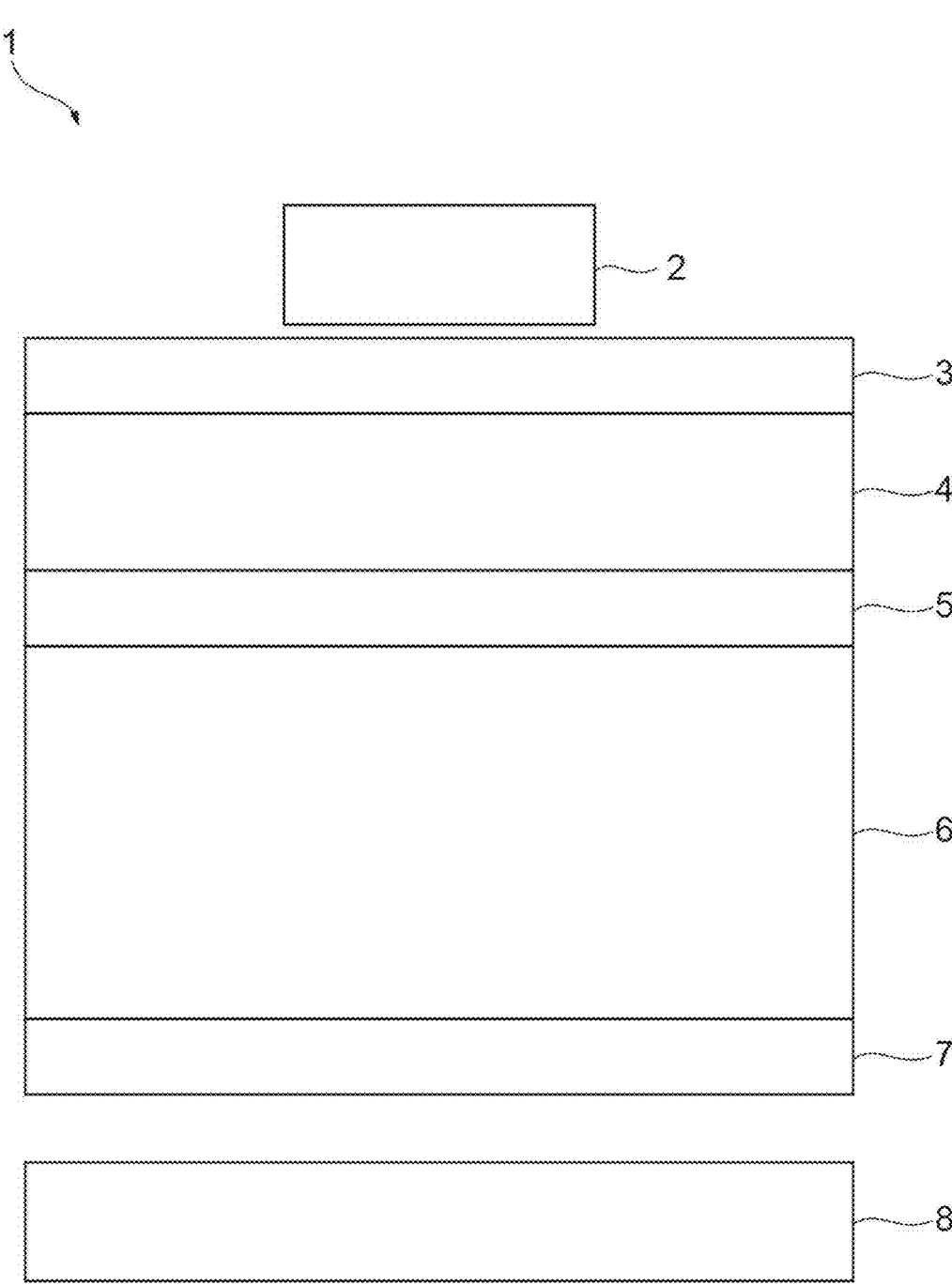
FIG. 1 is a diagram schematically illustrating an atomic oscillator having an alkali vapor cell according to a first embodiment.

Hereinafter, embodiments of the present disclosure will be described in detail with reference to the drawings. In the drawings, the same or corresponding parts are denoted by the same reference numerals, and redundant description will be omitted.

First Embodiment

[Configuration and Operation of Atomic Oscillator]

As illustrated in FIG. 1, an atomic oscillator 1 includes a light source 2, a heater 3, a spacer 4, an optical element 5, an alkali vapor cell 6, a heater 7, and a photodetector 8. The atomic oscillator 1 is used for a quantum sensor such as an atomic clock, a gyro sensor, or a magnetic sensor.

The light source 2 irradiates the alkali vapor cell 6 with light. The light source 2 may be, for example, a light emitting element such as a vertical cavity surface emitting laser (VCSEL). The light from the light source 2 pumps atoms of an alkali metal enclosed in the alkali vapor cell 6. The heater 3 is disposed between the light source 2 and the spacer 4. The heater 3 is used to adjust the temperature of the light source 2. The spacer 4 is disposed between the light source 2 and the optical element 5. The optical element 5 is disposed between the spacer 4 and the alkali vapor cell 6. The optical element 5 is a wave plate for changing the polarization direction of light from the light source 2 to a specific direction.

The alkali vapor cell 6 is a container that encloses the alkali metal and a buffer gas. A detailed configuration of the alkali vapor cell 6 will be described later. The heater 7 is disposed between the alkali vapor cell 6 and the photodetector 8. The heater 7 is used to adjust the temperature of the alkali vapor cell 6. The photodetector 8 detects light that has transmitted through the alkali vapor cell 6. The photodetector 8 is configured to include an element that converts light into an electric signal, such as a photodiode.

The alkali vapor cell 6 is heated by the heater 7, and thereby an alkali metal gas is generated inside the alkali vapor cell 6. In this state, the light emitted from the light source 2 passes through the optical element 5 to enter the alkali vapor cell 6. The alkali metal atoms enclosed in the alkali vapor cell 6 are pumped by the light irradiation. The light that has transmitted through the alkali vapor cell 6 is detected by the photodetector 8 and converted into an electric signal. The signal acquired by the photodetector 8 is used as feedback information, for example, for controlling the light source 2.

[Configuration of Alkali Vapor Cell]

Figure 2:
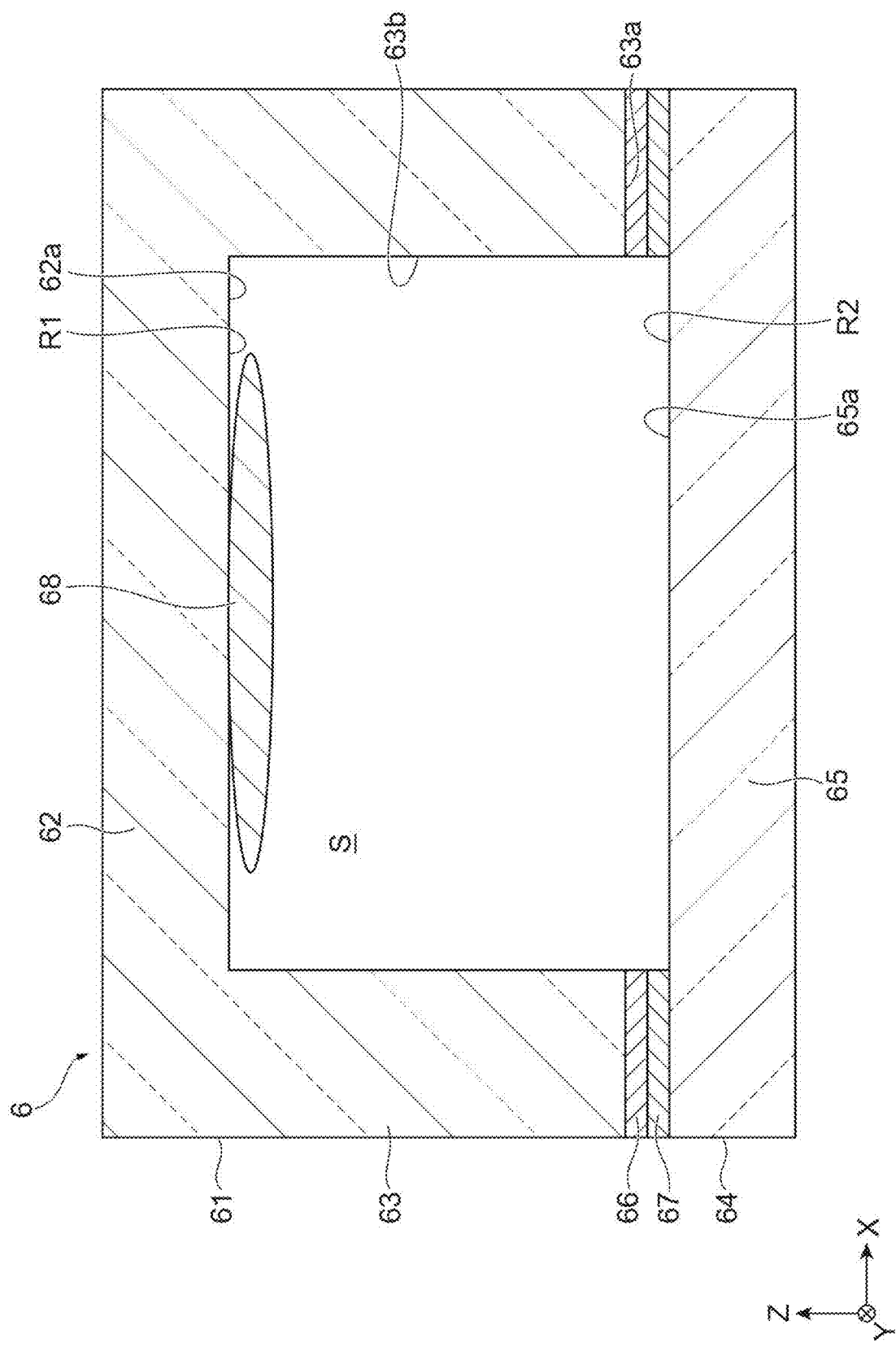
FIG. 2 is a cross-sectional view of the alkali vapor cell according to the first embodiment.
Figure 3:
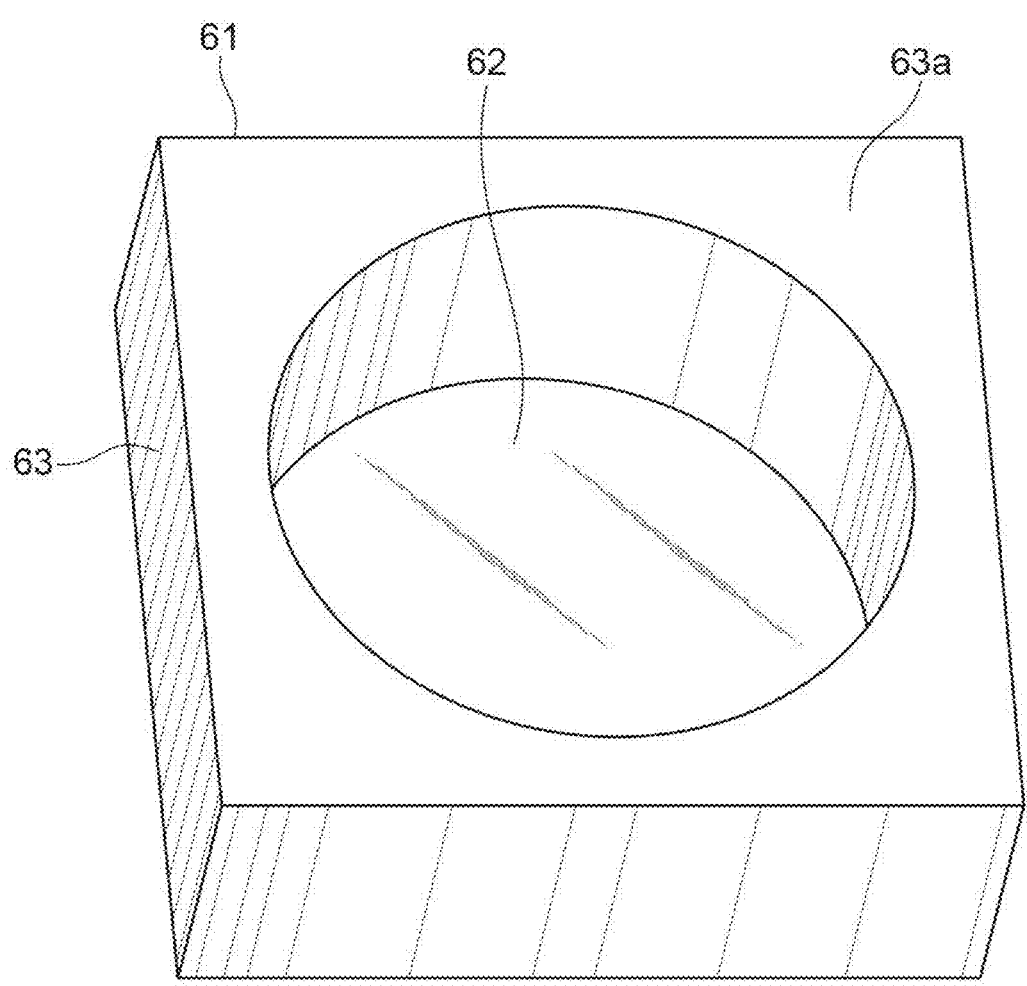
FIG. 3 is a perspective view illustrating a first member.

A detailed configuration of the alkali vapor cell 6 will be described with reference to FIGS. 2 and 3. The alkali vapor cell 6 includes a first member 61, a second member 64, a first metal film 66, a second metal film 67, and an alkali metal 68. Hereinafter, a direction of light incidence with respect to the alkali vapor cell 6 is referred to as a Z-axis direction, one direction perpendicular to the Z-axis direction is referred to as an X-axis direction, and a direction perpendicular to the Z-axis direction and the X-axis direction is referred to as a Y-axis direction.

The first member 61 includes a substrate portion (first substrate portion) 62 and a frame portion 63 integrally formed with the substrate portion 62. The substrate portion 62 and the frame portion 63 are formed of, for example, an amorphous material having no crystal structure such as glass or a crystal material having a crystal structure such as silicon or sapphire. The substrate portion 62 and the frame portion 63 have optical transparency. The optical transparency is the property of a material to allow light from the light source 2 to pass through the material.

The substrate portion 62 is formed in a rectangular plate shape having a thickness along the Z-axis direction. The width of the substrate portion 62 along the X-axis direction and the width of the substrate portion 62 along the Y-axis direction are, for example, about 2 to 10 mm. The frame portion 63 is formed on one main surface 62a of the substrate portion 62, and surrounds a space S on the main surface 62a. The frame portion 63 is formed along the outer edge of the main surface 62a. As illustrated in FIG. 3, as viewed from the thickness direction of the substrate portion 62, the inner edge of the frame portion 63 has a circular shape, and the outer edge of the frame portion 63 has a rectangular shape. That is, the outside shape of the alkali vapor cell 6 is a substantially rectangular parallelepiped shape, and the space S formed inside the alkali vapor cell 6 is a substantially cylindrical space. Alternatively, the space S formed internally may be configured to have a substantially rectangular parallelepiped shape. The frame portion 63 has a surface 63a opposite to the substrate portion 62. The surface 63a extends flat along the main surface 62a.

The second member 64 includes a substrate portion (second substrate portion) 65. The substrate portion 65 is formed of, for example, an amorphous material having no crystal structure such as glass or a crystal material having a crystal structure such as silicon or sapphire. The substrate portion 65 has optical transparency. The substrate portion 65 is formed in a rectangular plate shape having a thickness along the Z-axis direction. The width of the substrate portion 65 along the X-axis direction and the width of the substrate portion 65 along the Y-axis direction are, for example, about 2 to 10 mm.

Figure 4:
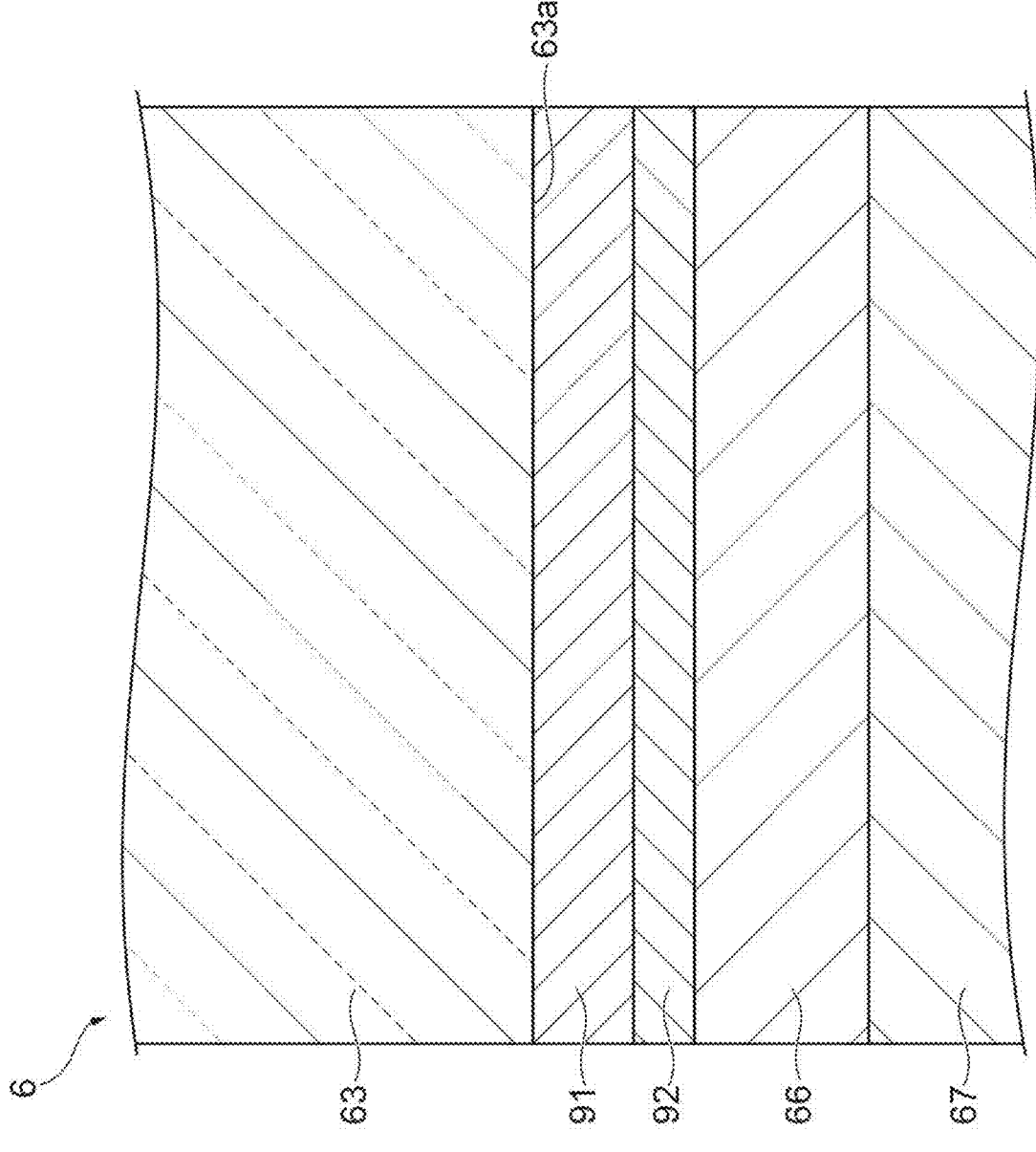
FIG. 4 is an enlarged cross-sectional view of a first metal film.

The first metal film 66 is formed in a frame shape on the surface of the first member 61. In this example, the first metal film 66 is formed on the surface 63a of the frame portion 63. Here, a detailed configuration of the first metal film 66 will be described with reference to FIG. 4. As illustrated in FIG. 4, the alkali vapor cell 6 further includes an adhesion layer (first layer) 91 and an anti-alloying layer (second layer) 92 located between the frame portion 63 and the first metal film 66.

The adhesion layer 91 is formed on the surface 63a of the frame portion 63. The adhesion layer 91 is in close contact with the surface 63a. The adhesion layer 91 is formed of chromium. The adhesion layer 91 may be formed of another material such as titanium. The thickness of the adhesion layer 91 may be, for example, about 20 nm.

The anti-alloying layer 92 is formed on the adhesion layer 91. The anti-alloying layer 92 is located between the adhesion layer 91 and the first metal film 66, and suppresses alloying between the material of the adhesion layer 91 and the material of the first metal film 66. The anti-alloying layer 92 is made of platinum. The anti-alloying layer 92 may be formed of another material such as nickel. The thickness of the anti-alloying layer 92 may be smaller than the thickness of the adhesion layer 91, and may be, for example, about 5 nm.

The first metal film 66 is formed on the anti-alloying layer 92. That is, the first metal film 66 is indirectly formed on the surface 63a of the frame portion 63 via the adhesion layer 91 and the anti-alloying layer 92. The first metal film 66 is made of gold. The first metal film 66 may be formed of another material such as silver, titanium, silicon, tungsten, or aluminum. The thickness of the first metal film 66 is 100 nm or less. The surface roughness (line roughness) Ra of the first metal film 66 formed on the surface of the first member 61 is 1.5 nm or less. The surface roughness Ra of the first metal film 66 is calculated by measuring the surface of the first metal film 66 over a range of 512 nm using, for example, a nanoscale hybrid microscope VN-8010 (made by KEYENCE CORPORATION) equipped with a cantilever OP-75041.

Figure 5:
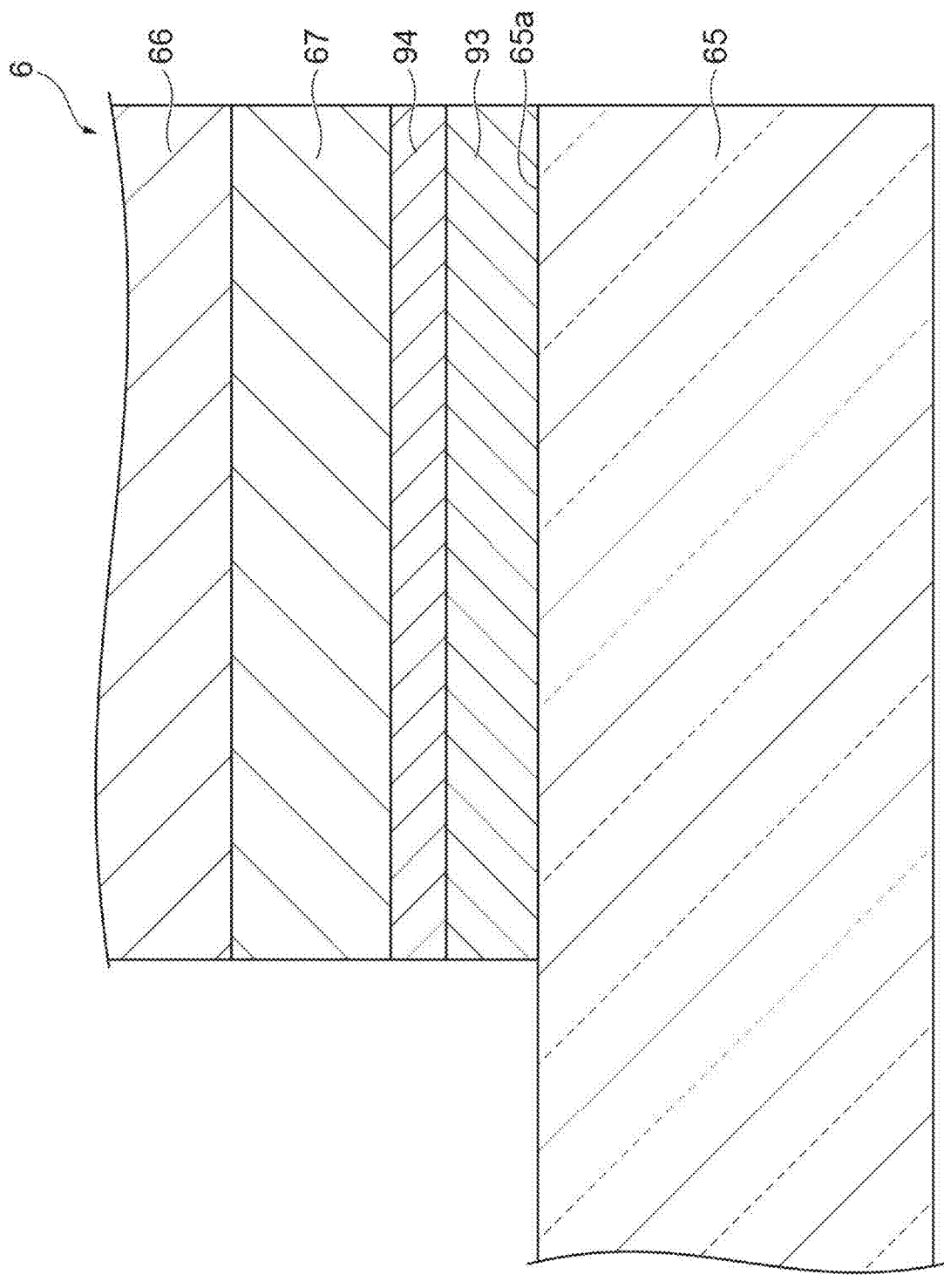
FIG. 5 is an enlarged cross-sectional view of a second metal film.

The second metal film 67 is formed in a frame shape on the surface of the second member 64. In this example, the second metal film 67 is formed on one main surface 65a of the substrate portion 65. More specifically, the second metal film 67 is formed along the outer edge of the main surface 65a. Here, a detailed configuration of the second metal film 67 will be described with reference to FIG. 5. As illustrated in FIG. 5, the alkali vapor cell 6 further includes an adhesion layer (third layer) 93 and an anti-alloying layer (fourth layer) 94 located between the substrate portion 65 and the second metal film 67.

The adhesion layer 93 is formed on the main surface 65a of the substrate portion 65. The adhesion layer 93 is in close contact with the main surface 65a. The adhesion layer 93 is formed of chromium. The adhesion layer 93 may be formed of another material such as titanium. The thickness of the adhesion layer 93 may be, for example, about 20 nm.

The anti-alloying layer 94 is formed on the adhesion layer 93. The anti-alloying layer 94 is located between the adhesion layer 93 and the second metal film 67, and suppresses alloying between the material of the adhesion layer 93 and the material of the second metal film 67. The anti-alloying layer 94 is made of platinum. The anti-alloying layer 94 may be formed of another material such as nickel. The thickness of the anti-alloying layer 94 may be smaller than the thickness of the adhesion layer 93, and may be, for example, about 5 nm.

The second metal film 67 is formed on the anti-alloying layer 94. That is, the second metal film 67 is indirectly formed on the main surface 65*a* of the substrate portion 65 via the adhesion layer 93 and the anti-alloying layer 94. The second metal film 67 is made of gold. The second metal film 67 may be formed of another material such as silver, titanium, silicon, tungsten, or aluminum. The thickness of the second metal film 67 is 100 nm or less. The surface roughness (line roughness) Ra of the second metal film 67 formed on the surface of the second member 64 is 1.5 nm or less. The surface roughness Ra of the second metal film 67 may be calculated by the same method as that for the surface roughness Ra of the first metal film 66.

The alkali metal 68 is disposed on a region (first region) R1 located inside the first metal film 66 on the surface of the first member 61. In this example, the region R1 includes a region constituting the inner peripheral surface 63*b* of the frame portion 63 and a region located inside the frame portion 63 on the main surface 62*a* of the substrate portion 62. The alkali metal 68 is disposed on the region of the main surface 62*a* located inside the frame portion 63. The alkali metal 68 is a simple substance of an alkali metal and contains no compound. The simple substance is a substance composed of only a single element. The compound is a substance made of two or more different elements chemically bonded together. That is, the alkali metal 68 is composed of a single alkali metal element, and does not contain a substance (for example, an azide) in which the alkali metal element is chemically bonded to another element. The alkali metal 68 may be, for example, cesium, rubidium, potassium, sodium, or lithium. The alkali metal 68 is a simple substance of an alkali metal, and may contain a plurality of simple substances of an alkali metal as long as it does not contain a compound, and for example, the alkali metal 68 may be a mixture of arbitrary two kinds of alkali metals of cesium, rubidium, potassium, sodium, or lithium.

The second member 64 is disposed on the surface 63*a* of the frame portion 63 such that the main surface 65*a* of the substrate portion 65 faces the main surface 62*a* of the substrate portion 62. The second member 64 is disposed such that the first metal film 66 and the second metal film 67 are in contact with each other. The first metal film 66 and the second metal film 67 are directly bonded to each other. The direct bonding means that objects to be bonded are bonded to each other without interposing another member therebetween. Since the first metal film 66 and the second metal film 67 are bonded together, a space (corresponding to the space S in the present embodiment) between the first member 61 and the second member 64 is hermetically sealed. The alkali metal 68 and a buffer gas are enclosed in the space between the first member 61 and the second member 64. The buffer gas is, for example, an inert gas such as nitrogen, argon, helium, or neon.

[Method for Producing Alkali Vapor Cell]

Next, a method for producing the alkali vapor cell 6 is described. First, the first member 61 and the second member 64 are prepared. Subsequently, the first metal film 66 is formed in a frame shape on the surface of the first member 61. In the present embodiment, the first metal film 66 is indirectly formed on the surface 63*a* of the frame portion 63 via the adhesion layer 91 and the anti-alloying layer 92. Specifically, first, the surface 63*a* of the frame portion 63 is flattened by polishing, and then the surface of the first member 61 is cleaned by ultrasonic cleaning. Then, as illustrated in FIG. 4, the adhesion layer 91 is formed of chromium on the surface 63*a*. The adhesion layer 91 is formed by, for example, sputtering (EB vapor deposition, resistance heating vapor deposition). Subsequently, the anti-alloying layer 92 is formed of platinum on the adhesion layer 91. The anti-alloying layer 92 is formed by, for example, sputtering (EB vapor deposition, resistance heating vapor deposition). Subsequently, the first metal film 66 is formed on the anti-alloying layer 92. The first metal film 66 is formed by, for example, sputtering (EB vapor deposition, resistance heating vapor deposition). The first metal film 66 is formed so as to have a thickness of 100 nm or less. In addition, the first metal film 66 is formed so that the surface roughness Ra of the first metal film 66 after the film formation is 1.5 nm or less. Subsequently, the surface of the first metal film 66 is cleaned by plasma treatment.

The second metal film 67 is formed in a frame shape on the surface of the second member 64. In the present embodiment, the second metal film 67 is indirectly formed on the main surface 65*a* of the substrate portion 65 via the adhesion layer 93 and the anti-alloying layer 94. Specifically, first, the main surface 65*a* of the substrate portion 65 is flattened by polishing, and then the surface of the second member 64 is cleaned by ultrasonic cleaning. Then, as illustrated in FIG. 5, the adhesion layer 93 is formed of chromium on the main surface 65*a*. The adhesion layer 93 is formed by, for example, sputtering (EB vapor deposition, resistance heating vapor deposition). Subsequently, the anti-alloying layer 94 is formed of platinum on the adhesion layer 93. The anti-alloying layer 94 is formed by, for example, sputtering (EB vapor deposition, resistance heating vapor deposition). Subsequently, the second metal film 67 is formed on the anti-alloying layer 94. The second metal film 67 is formed by, for example, sputtering (EB vapor deposition, resistance heating vapor deposition). The second metal film 67 is formed so as to have a thickness of 100 nm or less. In addition, the second metal film 67 is formed so that the surface roughness Ra of the second metal film 67 after the film formation is 1.5 nm or less. Subsequently, the surface of the second metal film 67 is cleaned by plasma treatment.

Subsequently, the alkali metal 68 is disposed on the region R1 of the first member 61. Here, details of the step of disposing the alkali metal 68 will be described with reference to FIGS. 6 and 7. First, the first metal film 66 is covered with a mask (first mask) 100. As illustrated in FIG. 7, the mask 100 includes a first portion 101 and a second portion 102 formed integrally with the first portion 101. The first portion 101 is formed in a cylindrical shape. The second portion 102 is formed in a thin plate shape having a circular opening at the center. The inner edge of the second portion 102 defining the opening is connected to one end of the first portion 101. The mask 100 is formed of, for example, a metal material such as a Kovar metal. The thickness of the mask 100 may be 0.5 mm or more and 1 mm or less.

Figure 6:
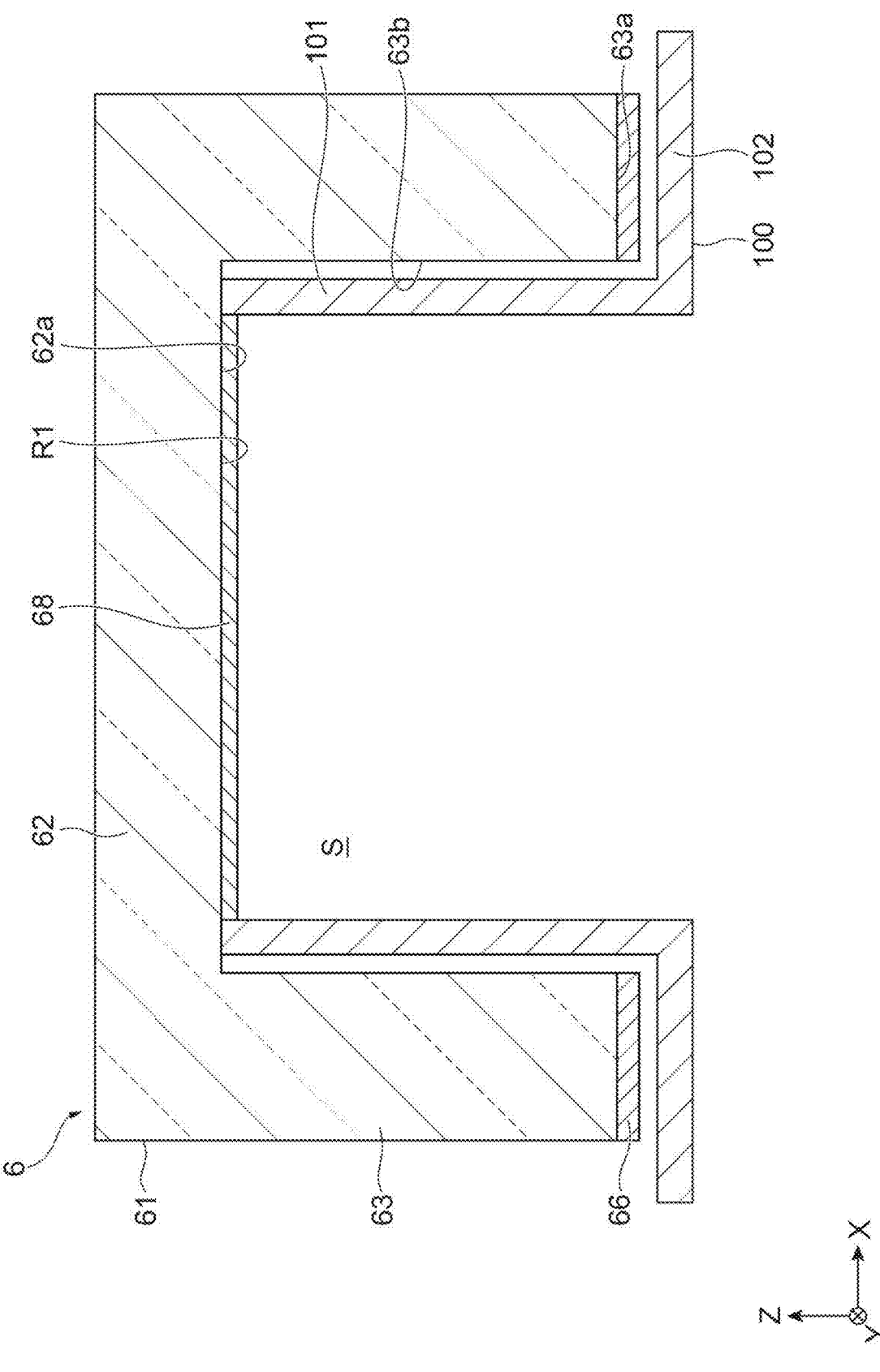
FIG. 6 is a diagram for explanation of a method for producing the alkali vapor cell of FIG. 2.
Figure 7:
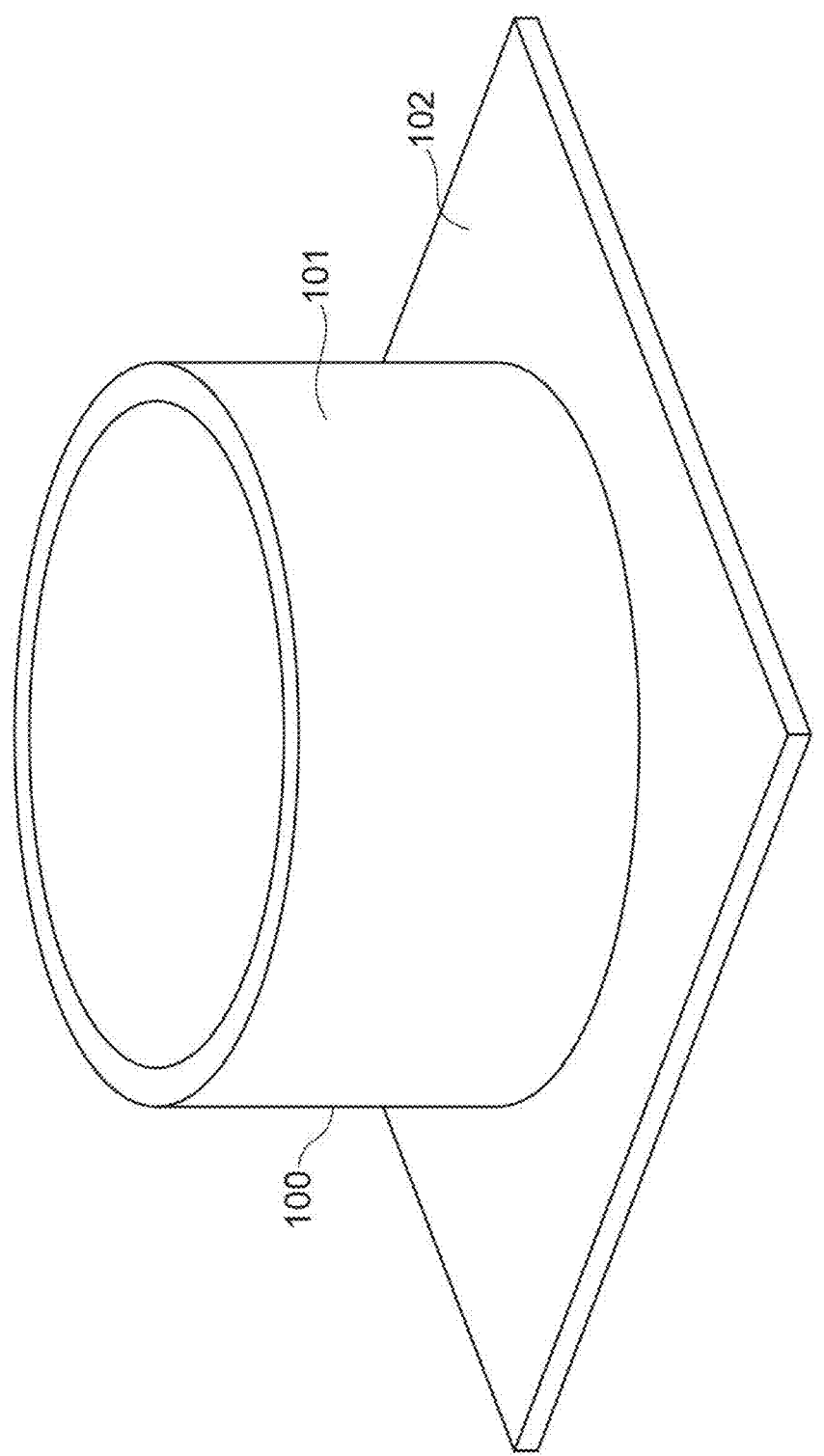
FIG. 7 is a perspective view illustrating a mask.

As illustrated in FIG. 6, the mask 100 is disposed on the first member 61, and the first metal film 66 is covered with the mask 100. In the present embodiment, the mask 100 is disposed such that the first portion 101 extends along the inner peripheral surface 63*b* of the frame portion 63 and the second portion 102 extends along the surface of the first metal film 66 (the surface 63*a* of the frame portion 63). At this time, the first portion 101 is slightly apart from the inner peripheral surface 63*b*, and the second portion 102 is slightly apart from the surface of the first metal film 66. The other end of the first portion 101 is in contact with the main surface 62*a* of the substrate portion 62.

Subsequently, in a state where the first metal film 66 is covered with the mask 100, the alkali metal 68 is disposed on the region R1 of the first member 61. In the present embodiment, a film made of a simple substance of an alkali metal is formed on the main surface 62a of the substrate portion 62 by vapor deposition. After the alkali metal 68 is disposed, the mask 100 is removed from the first member 61. Then, a buffer gas is introduced into the space S.

Subsequently, the first metal film 66 and the second metal film 67 are directly bonded to each other in a normal temperature environment. The normal temperature environment is a temperature environment of 5° C. or higher and 35° C. or lower, and more preferably a temperature environment of 20° C. or higher and 30° C. or lower. In the present embodiment, the second member 64 is disposed on the frame portion 63 such that the first metal film 66 and the second metal film 67 are in contact with each other. In other words, the second member 64 is disposed on the surface 63a of the frame portion 63 such that the main surface 65a of the substrate portion 65 faces the main surface 62a of the substrate portion 62. Then, the first metal film 66 and the second metal film 67 are directly bonded to each other so as to hermetically seal the space S. In the present embodiment, the first metal film 66 and the second metal film 67 are directly bonded to each other in a state where pressure in a direction to bring the first member 61 and the second member 64 close to each other is applied to the first member 61 and the second member 64. The pressure applied to the first member 61 and the second member 64 may be, for example, 125 kgf/42 mm² or more and 125 kgf/32 mm² or less (30 N/mm² or more and 40 N/mm² or less). Thus, the alkali vapor cell 6 is obtained.

[Functions and Effects]

In the method for producing the alkali vapor cell 6 according to the present embodiment, the first metal film 66 and the second metal film 67 are formed so that the thickness of each of the first metal film 66 and the second metal film 67 is 100 nm or less. This reduces the surface roughness of the first metal film 66 and the second metal film 67, so that the first metal film 66 and the second metal film 67 can be directly bonded to each other in a normal temperature environment. That is, in the method for producing the alkali vapor cell 6, heating is not required when the first metal film 66 and the second metal film 67 are bonded together, which can reduce the fluctuations in gas pressure inside the alkali vapor cell 6. In the method for producing the alkali vapor cell 6, the simple substance of the alkali metal (alkali metal 68) is disposed. Therefore, the fluctuations in gas pressure in the alkali vapor cell 6 can be reduced as compared with a case where a compound of an alkali metal (for example, an azide) is decomposed in the alkali vapor cell to obtain a simple substance of an alkali metal. Thus, according to the method for producing the alkali vapor cell 6, it is possible to produce the alkali vapor cell 6 with which efficient measurement can be made.

Figure 8:
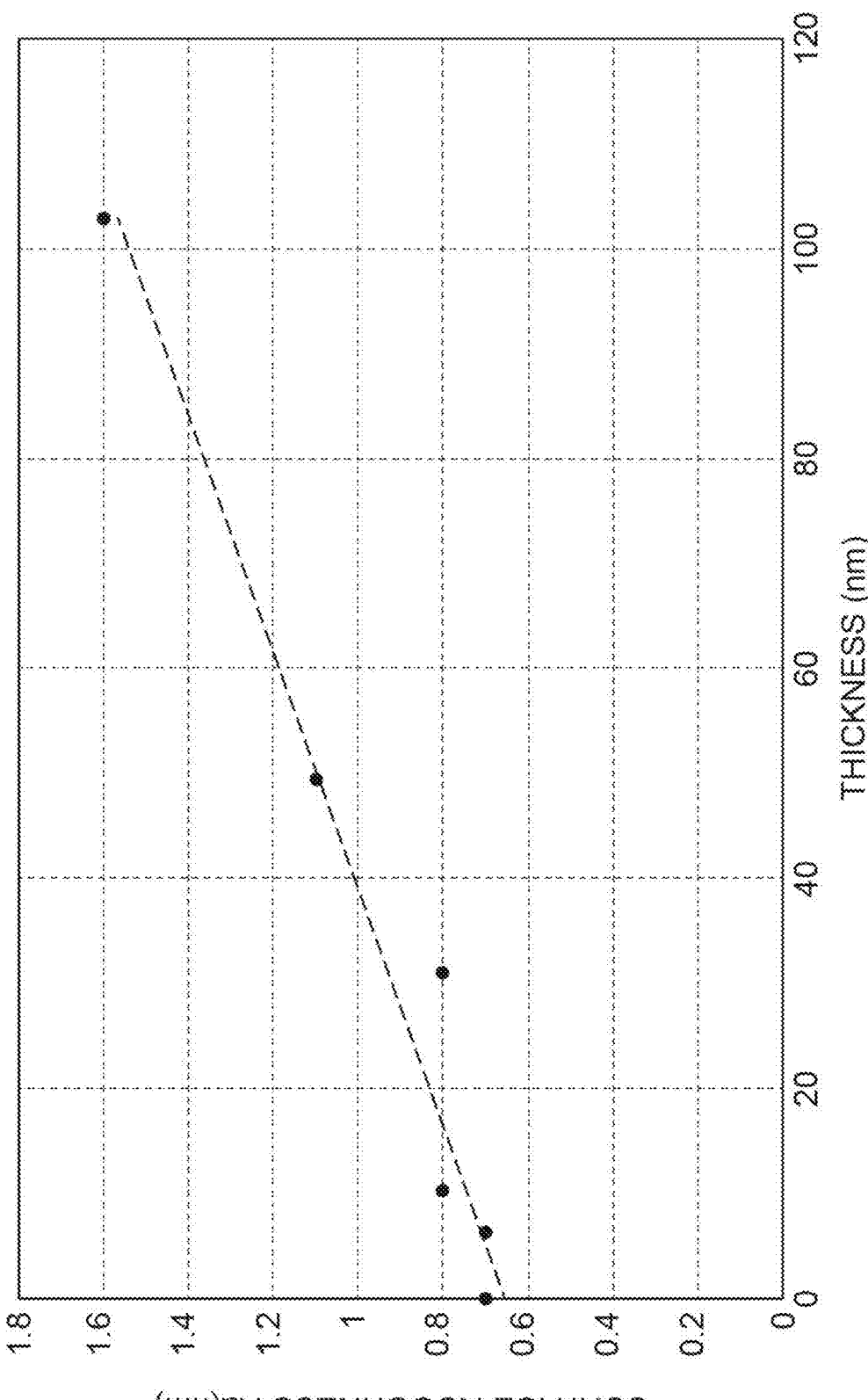
FIG. 8 is a graph showing a relationship between a thickness and surface roughness of a first metal film.

The functions and effects of the above-described method for producing the alkali vapor cell 6 will be described in more detail. First, the relationship between the thicknesses and the surface roughness of the first metal film 66 and the second metal film 67, and the possibility of bonding between the first metal film 66 and the second metal film 67 will be described with reference to FIGS. 8 and 9. FIG. 8 is a graph showing the relationship between the thickness and the surface roughness Ra of the first metal film 66. FIG. 9 is a table showing measured values of the thickness and surface roughness Ra of the first metal film 66, and the possibility of direct bonding between the first metal film 66 and the second metal film 67 in a normal temperature environment.

The first metal film 66 was indirectly formed on the surface 63a of the frame portion 63 via the adhesion layer 91 and the anti-alloying layer 92, and the thickness and the surface roughness Ra of the first metal film 66 were measured. The thickness of the adhesion layer 91 was 20 nm, and chromium was used as a material thereof. The thickness of the anti-alloying layer 92 was 5 nm, and platinum was used as a material thereof. Gold was used as a material of the first metal film 66. The surface roughness Ra was calculated by measuring the surface of an object to be measured over a range of 512 nm using a nanoscale hybrid microscope VN-8010 (made by KEYENCE CORPORATION) equipped with a cantilever OP-75041. The surface roughness Ra for a case where the thickness is 0 nm (the first metal film 66 is not formed) corresponds to the surface roughness of the anti-alloying layer 92. The measurement results are shown in FIGS. 8 and 9.

The column of "bonding" in the table of FIG. 9 indicates whether or not the first metal film 66 and the second metal film 67 having the same thickness as that of the first metal film 66 could be directly bonded to each other in a normal temperature environment. As with the first metal film 66, the second metal film 67 was indirectly formed on the main surface 65a of the substrate portion 65 via the adhesion layer 93 and the anti-alloying layer 94. The materials and thicknesses of the adhesion layer 93 and the anti-alloying layer 94 are the same as those of the adhesion layer 91 and the anti-alloying layer 92. The material of the second metal film 67 is the same as the material of the first metal film 66. The symbol "A" indicates that the first metal film 66 and the second metal film 67 could be directly bonded to each other in a normal temperature environment, and the symbol "B" indicates that the first metal film 66 and the second metal film 67 could not be directly bonded to each other in a normal temperature environment.

As can be seen from FIGS. 8 and 9, the surface roughness Ra decreases as the thickness of the first metal film 66 decreases. The second metal film 67 has the same configuration as the first metal film 66. Therefore, similarly to the first metal film 66, it is also apparent that the surface roughness Ra of the second metal film 67 decreases as the thickness of the second metal film 67 decreases. As illustrated in FIG. 9, in a case where the first metal film 66 and the second metal film 67 have a thickness of 102.9 nm or less, the first metal film 66 and the second metal film 67 could be directly bonded together in a normal temperature environment. On the other hand, in a case where the first metal film 66 and the second metal film 67 have a thickness of 179.1 nm or more, the first metal film 66 and the second metal film 67 could not be directly bonded together in a normal temperature environment. Based on these results, it can be seen that in a case where the first metal film 66 and the second metal film 67 have a thickness of 100 nm or less, as in the method for producing the alkali vapor cell 6 according to the present embodiment, the first metal film 66 and the second metal film 67 can be directly bonded together in a normal temperature environment.

In addition, in the production process of an alkali vapor cell, a method has been known in which members constituting a container for enclosing an alkali metal are bonded to each other by anodic bonding. Since the anodic bonding is performed by applying a voltage while members to be bonded are heated, the pressure of the gas enclosed in the alkali vapor cell fluctuates due to the heat. In contrast, in the alkali vapor cell 6 according to the present embodiment, heating is not required when the first metal film 66 and the second metal film 67 are bonded together, which can reduce the fluctuations in gas pressure inside the alkali vapor cell 6.

Further, in the production process of an alkali vapor cell, a method of disposing a compound of an alkali metal is conventionally known. For example, in a case where an azide of an alkali metal is disposed, the azide is enclosed and then decomposed to obtain a simple substance of the alkali metal and a nitrogen gas (buffer gas). In this method, oxidation of the alkali metal can be reduced, but the gas pressure inside the alkali vapor cell may vary depending on the amount of decomposition of the azide, or the azide that has not been completely decomposed may remain, and the gas pressure may fluctuate (drift) with time. In contrast, in the method for producing the alkali vapor cell 6 according to the present embodiment, since the alkali metal 68 (simple substance of the alkali metal) is disposed, it is not necessary to decompose the compound of the alkali metal, which can reduce the fluctuations in gas pressure inside the alkali vapor cell 6.

Figure 10:
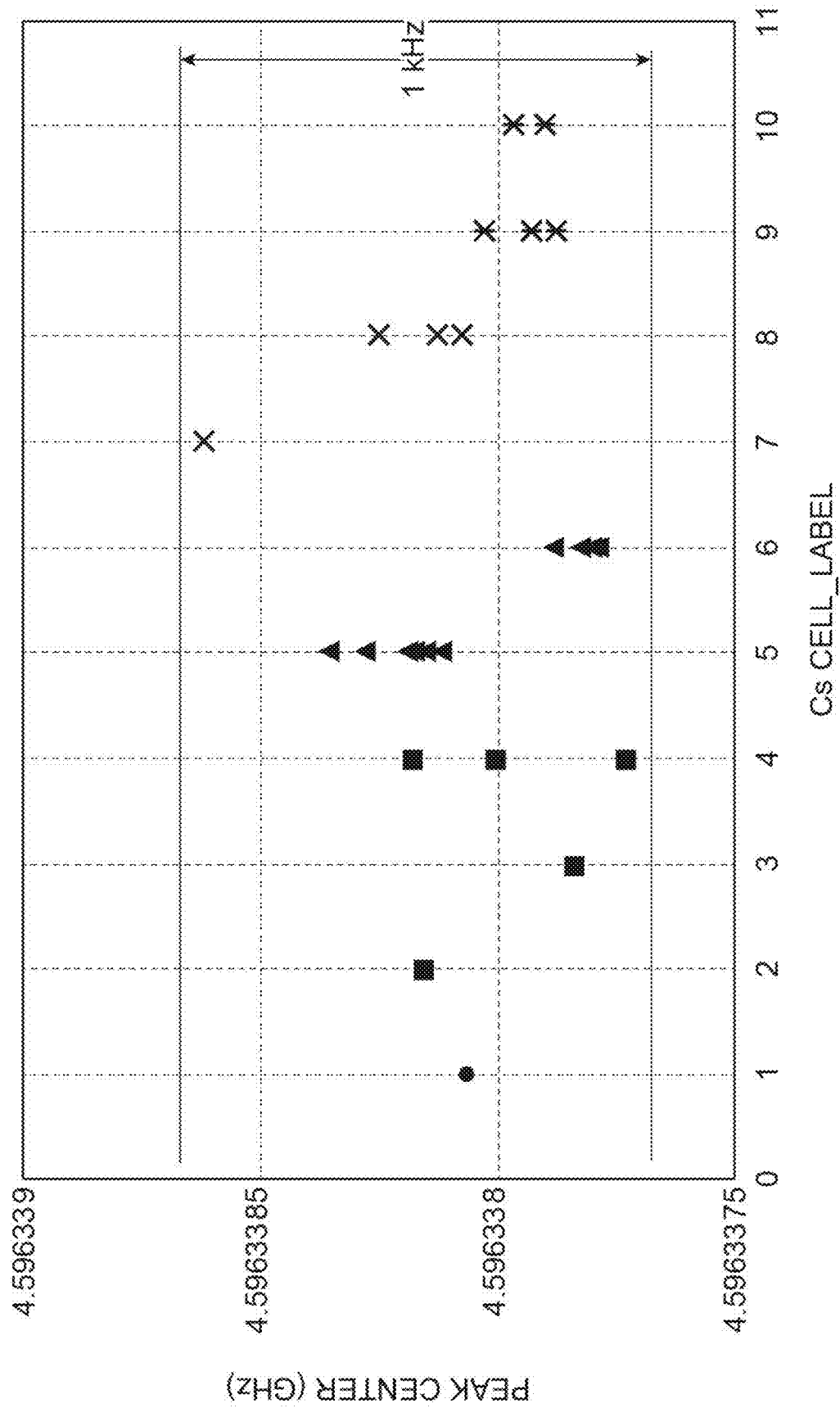
FIG. 10 is a graph showing measurement results of peak centers of CPT resonance in a plurality of alkali vapor cells.

FIG. 10 is a graph showing measurement results of peak centers of coherent population trapping (CPT) resonance in a plurality of alkali vapor cells 6. The plurality of alkali vapor cells 6 were produced in the production method according to the first embodiment, and the peak center (unit: GHz) of CPT resonance was measured in each alkali vapor cell 6. In FIG. 10, the measurement results of the alkali vapor cells 6 produced in the same lot are shown in the same plot. In a conventional production method in which heat is applied when members constituting a container for enclosing an alkali metal are bonded together, it is known that variations (fluctuations) in peak center occur at a large frequency width of about 15 kHz. In contrast, as illustrated in FIG. 10, according to the method for producing the alkali vapor cell 6 of the present embodiment, variations in peak center could be kept at a small frequency width of about 1 kHz. In other words, according to the method for producing the alkali vapor cell 6 of the present embodiment, it was confirmed that the alkali vapor cell 6 having a small fluctuation in gas pressure can be produced.

In the step of forming the first metal film 66, the first metal film 66 is formed of gold, and in the step of forming the second metal film 67, the second metal film 67 is formed of gold. This can suppress the oxidation of the first metal film 66 and the second metal film 67.

The step of disposing the alkali metal 68 includes a step of disposing the alkali metal 68 on the region R1 in a state where the first metal film 66 is covered with the mask 100. This can suppress the alkali metal 68 from adhering to the surface of the first metal film 66 when the alkali metal 68 is disposed.

The mask 100 is formed of metal and has a thickness of 0.5 mm or more and 1 mm or less. Accordingly, since the mask 100 has a certain degree of mechanical strength, the first metal film 66 can be appropriately covered with the mask 100.

In the step of forming the first metal film 66, the adhesion layer 91 is formed of chromium on the surface of the first member 61 (the surface 63a of the frame portion 63), the anti-alloying layer 92 is formed of platinum on the adhesion layer 91, and the first metal film 66 is formed on the anti-alloying layer 92. As a result, since the adhesion layer 91 is in close contact with the surface of the first member 61, it is possible to suppress the first metal film 66 from being peeled off from the surface of the first member 61. Further, the anti-alloying layer 92 can suppress alloying between the material of the adhesion layer 91 and the material of the first metal film 66.

In the step of forming the second metal film 67, the adhesion layer 93 is formed of chromium on the surface of the second member 64 (the main surface 65a of the substrate portion 65), the anti-alloying layer 94 is formed of platinum on the adhesion layer 93, and the second metal film 67 is formed on the anti-alloying layer 94. As a result, since the adhesion layer 93 is in close contact with the surface of the second member 64, it is possible to suppress the second metal film 67 from being peeled off from the surface of the second member 64. Further, the anti-alloying layer 94 can suppress alloying between the material of the adhesion layer 93 and the material of the second metal film 67.

The method for producing the alkali vapor cell 6 includes a step of cleaning the surface of the first metal film 66 by plasma treatment. This enables the first metal film 66 to be bonded to the second metal film 67 appropriately.

The method for producing the alkali vapor cell 6 includes a step of cleaning the surface of the second metal film 67 by plasma treatment. This enables the second metal film 67 to be bonded to the first metal film 66 appropriately.

In the step of forming the first metal film 66, the first metal film 66 is formed so that the surface roughness of the first metal film 66 is 1.5 nm or less. As a result, the surface roughness of the first metal film 66 is reduced, so that the first metal film 66 and the second metal film 67 can be directly bonded together more reliably in a normal temperature environment.

In the step of forming the second metal film 67, the second metal film 67 is formed so that the surface roughness of the second metal film 67 is 1.5 nm or less. As a result, the surface roughness of the second metal film 67 is reduced, so that the first metal film 66 and the second metal film 67 can be directly bonded together more reliably in a normal temperature environment.

In the step of directly bonding the first metal film 66 and the second metal film 67 to each other, the first metal film 66 and the second metal film 67 are directly bonded to each other in a state where pressure in a direction to bring the first member 61 and the second member 64 close to each other is applied to the first member 61 and the second member 64. This enables the first metal film 66 and the second metal film 67 to be bonded together more reliably.

The first member 61 includes the substrate portion 62 having optical transparency and the frame portion 63 that is formed on the main surface 62a of the substrate portion 62 and surrounds the space S on the main surface 62a. The second member 64 includes the substrate portion 65 having optical transparency. In the step of forming the first metal film 66, the first metal film 66 is formed on the surface 63a of the frame portion 63. In the step of forming the second metal film 67, the second metal film 67 is formed on the main surface 65a of the substrate portion 65. In the step of directly bonding the first metal film 66 and the second metal film 67 to each other, the second member 64 is disposed on the frame portion 63, and the first metal film 66 and the second metal film 67 are directly bonded to each other so as to hermetically seal the space S. As a result, a space in which the alkali metal 68 is enclosed can be appropriately formed in the alkali vapor cell 6.

In the method for producing the alkali vapor cell 6 according to the present embodiment, the first metal film 66 and the second metal film 67 are formed so that the surface roughness of each of the first metal film 66 and the second metal film 67 is 1.5 nm or less. This reduces the surface roughness of the first metal film 66 and the second metal film 67, so that the first metal film 66 and the second metal film 67 can be directly bonded to each other in a normal temperature environment. That is, in the method for producing the alkali vapor cell 6, heating is not required when the first metal film 66 and the second metal film 67 are bonded together, which can reduce the fluctuations in gas pressure inside the alkali vapor cell 6. In the method for producing the alkali vapor cell 6, the simple substance of the alkali metal (alkali metal 68) is disposed. Therefore, the fluctuations in gas pressure in the alkali vapor cell 6 can be reduced as compared with a case where a compound of an alkali metal is decomposed in the alkali vapor cell 6 to obtain a simple substance of the alkali metal. Thus, according to the method for producing the alkali vapor cell 6, it is possible to produce the alkali vapor cell 6 with which efficient measurement can be made.

In the alkali vapor cell 6 according to the present embodiment, the first metal film 66 and the second metal film 67 each have a thickness of 100 nm or less and the surface roughness of the first metal film 66 and the second metal film 67 is reduced. Therefore, in the production process of the alkali vapor cell 6, the first metal film 66 and the second metal film 67 can be directly bonded to each other in a normal temperature environment. That is, heating is not required in order to bond the first metal film 66 and the second metal film 67 together, which can reduce the fluctuations in gas pressure inside the alkali vapor cell 6. In the alkali vapor cell 6, the simple substance of the alkali metal (alkali metal 68) is disposed. In a case where a compound of the alkali metal is disposed, it is necessary to decompose the compound in order to obtain a simple substance of the alkali metal; however, in the alkali vapor cell 6, such a decomposition treatment is unnecessary, which can reduce the fluctuations in gas pressure inside the alkali vapor cell 6. Therefore, according to the alkali vapor cell 6, measurement can be efficiently made.

Second Embodiment

[Configuration of Alkali Vapor Cell]

Figure 11:
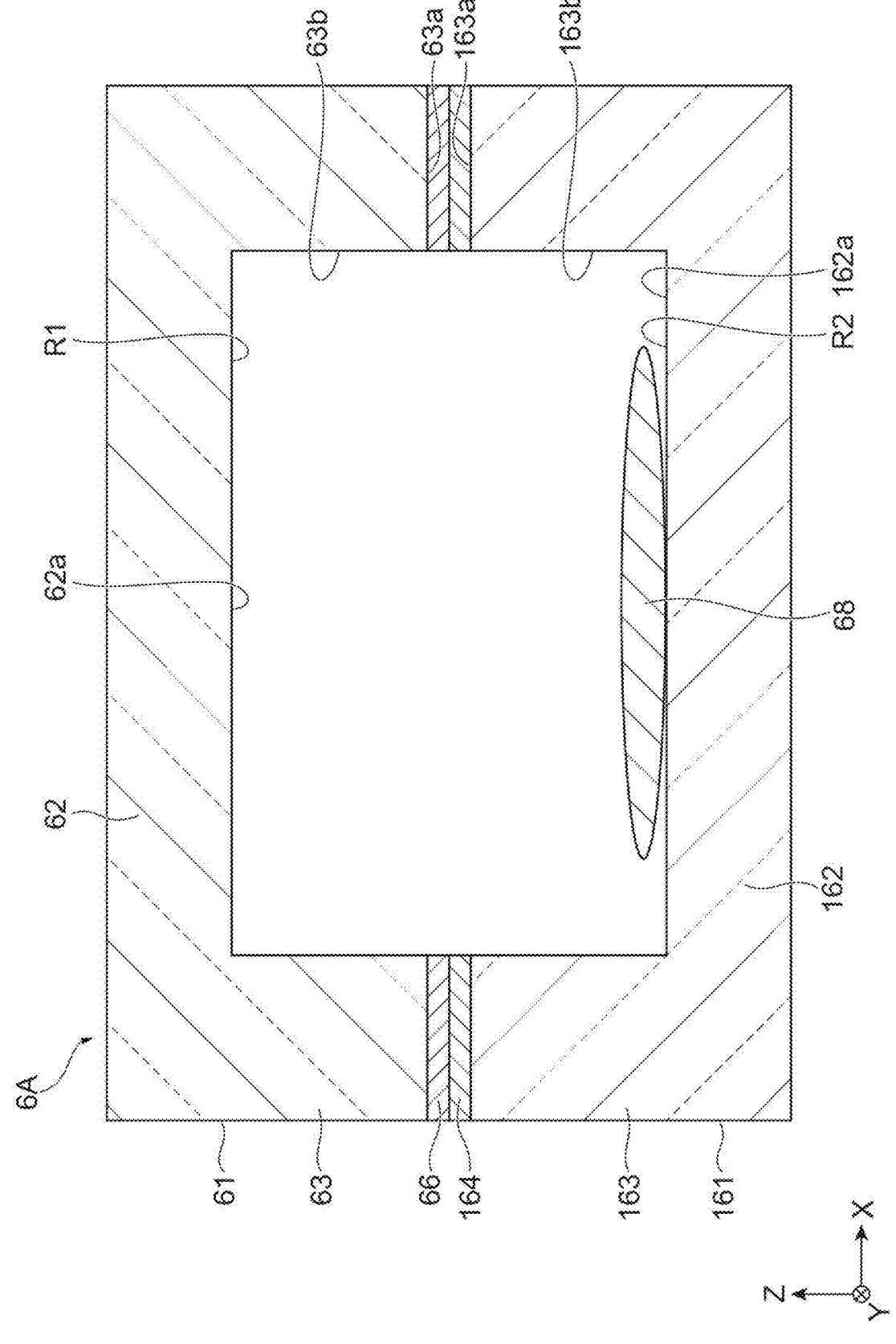
FIG. 11 is a cross-sectional view of an alkali vapor cell according to a second embodiment.

FIG. 11 is an enlarged cross-sectional view of an alkali vapor cell 6A according to the second embodiment. The alkali vapor cell 6A according to the present embodiment includes a first member 61, a second member 161, a first metal film 66, a second metal film 164, and an alkali metal 68.

The configurations of the first member 61 and the first metal film 66 included in the alkali vapor cell 6A are similar to the configurations of the first member 61 and the first metal film 66 included in the alkali vapor cell 6. Further, the alkali vapor cell 6A further includes an adhesion layer and an anti-alloying layer located between the surface of the first member 61 and the first metal film 66. The configurations of the adhesion layer and the anti-alloying layer included in the alkali vapor cell 6A are similar to the configurations of the adhesion layer 91 and the first metal film 66 (see FIG. 4) included in the alkali vapor cell 6.

The second member 161 includes a substrate portion (second substrate portion) 162 and a frame portion 163 integrally formed with the substrate portion 162. The substrate portion 162 and the frame portion 163 are formed of, for example, an amorphous material having no crystal structure such as glass or a crystal material having a crystal structure such as silicon or sapphire. The substrate portion 162 and the frame portion 163 have optical transparency.

The substrate portion 162 is formed in a rectangular plate shape having a thickness along the Z-axis direction. The width of the substrate portion 162 along the X-axis direction and the width of the substrate portion 162 along the Y-axis direction are, for example, about 2 to 10 mm. The frame portion 163 is formed on one main surface 162a of the substrate portion 162, and surrounds a space on the main surface 162a. The frame portion 163 is formed along the outer edge of the main surface 162a. As with the frame portion 63, as viewed from the Z-axis direction, the inner edge of the frame portion 163 has a circular shape, and the outer edge of the frame portion 163 has a rectangular shape. The frame portion 163 has a surface 163a opposite to the substrate portion 162. The surface 163a extends flat along the main surface 162a.

The second metal film 164 is formed in a frame shape on the surface of the second member 161. In this example, the second metal film 164 is formed on the surface 163a of the frame portion 163. The alkali vapor cell 6A further includes an adhesion layer and an anti-alloying layer located between the surface 163a and the second metal film 164. The adhesion layer is formed on the surface 163a and adheres to the surface 163a. The anti-alloying layer is formed on the adhesion layer, and suppresses alloying between the material of the adhesion layer and the material of the second metal film 164. The adhesion layer and the anti-alloying layer located between the surface 163a and the second metal film 164 may have the same material and thickness as those of the adhesion layer 91 and the anti-alloying layer 92.

The second metal film 164 is indirectly formed on the surface 163a of the frame portion 163 via the adhesion layer and the anti-alloying layer. The second metal film 164 is made of gold. The second metal film 164 may be formed of another material such as silver, titanium, silicon, tungsten, or aluminum. The thickness of the second metal film 164 is 100 nm or less. The surface roughness (line roughness) Ra of the second metal film 164 formed on the surface of the second member 161 is 1.5 nm or less. The surface roughness Ra of the second metal film 164 may be calculated by the same method as that for the surface roughness Ra of the first metal film 66.

The alkali metal 68 is disposed on a region (second region) R2 located inside the second metal film 164 on the surface of the second member 161. In this example, the region R2 includes a region constituting the inner peripheral surface 163b of the frame portion 163 and a region located inside the frame portion 163 on the main surface 162a of the substrate portion 162. In the present embodiment, the alkali metal 68 is disposed on a region of the main surface 162a located inside the frame portion 163.

The second member 161 is disposed on the surface 63a of the frame portion 63 such that the main surface 162a of the substrate portion 162 faces the main surface 62a of the substrate portion 62. The second member 161 is disposed such that the first metal film 66 and the second metal film 164 are in contact with each other. The first metal film 66 and the second metal film 164 are directly bonded to each other. Since the first metal film 66 and the second metal film 164 are bonded together, a space between the first member 61 and the second member 161 is hermetically sealed. The alkali metal 68 and a buffer gas are enclosed in the space between the first member 61 and the second member 161.

[Method for Producing Alkali Vapor Cell]

A method for producing the alkali vapor cell 6A is described. First, the first member 61 and the second member 161 are prepared. Subsequently, the first metal film 66 is formed in a frame shape on the surface of the first member 61 and the surface of the first metal film 66 is cleaned. A method for forming the first metal film 66 and a method for cleaning the first metal film 66 are the same as the methods described in the first embodiment.

Subsequently, the second metal film 67 is formed in a frame shape on the surface of the second member 161. In the present embodiment, the second metal film 164 is indirectly formed on the surface 163a of the frame portion 163 via the adhesion layer and the anti-alloying layer. Specifically, first, the surface 163a of the frame portion 163 is flattened by polishing, and then the surface of the second member 161 is cleaned by ultrasonic cleaning. Then, the adhesion layer and the anti-alloying layer are formed on the surface 163a by the same method as the method for forming the adhesion layer 91 and the anti-alloying layer 92.

Subsequently, the second metal film 164 is formed on the anti-alloying layer. The second metal film 164 is formed by, for example, sputtering (EB vapor deposition, resistance heating vapor deposition). The second metal film 164 is formed so as to have a thickness of 100 nm or less. In addition, the second metal film 164 is formed so that the surface roughness Ra of the second metal film 164 after the film formation is 1.5 nm or less. Subsequently, the surface of the second metal film 164 is cleaned by plasma treatment.

Subsequently, the alkali metal 68 is disposed on the region R2 of the second member 161. At this time, in a state where the second metal film 164 is covered with a mask (second mask), the alkali metal 68 is disposed on the region R2. The mask covering the second metal film 164 may have a configuration similar to that of the mask 100 illustrated in FIG. 7. That is, in the present embodiment, the mask 100 may constitute the second mask. In the present embodiment, a film made of a simple substance of an alkali metal is formed on the main surface 162a of the substrate portion 162 by vapor deposition. After the alkali metal 68 is disposed, the mask is removed from the second member 161. Subsequently, a buffer gas is introduced into the space surrounded by the frame portion 63 and the frame portion 163.

Then, the second member 161 is disposed on the first member 61 such that the first metal film 66 and the second metal film 164 are in contact with each other. In the present embodiment, the second member 161 is disposed on the surface 63a of the frame portion 63 such that the main surface 162a of the substrate portion 162 faces the main surface 62a of the substrate portion 62.

Subsequently, the first metal film 66 and the second metal film 164 are directly bonded to each other in a normal temperature environment. In the present embodiment, the first metal film 66 and the second metal film 164 are directly bonded to each other in a state where pressure in a direction to bring the first member 61 and the second member 161 close to each other is applied to the first member 61 and the second member 161. Thus, the alkali vapor cell 6A is obtained.

As with the first embodiment, in the method for producing the alkali vapor cell 6A according to the present embodiment, the first metal film 66 and the second metal film 164 are formed so that the thickness of each of the first metal film 66 and the second metal film 164 is 100 nm or less. Therefore, the first metal film 66 and the second metal film 164 can be directly bonded to each other in a normal temperature environment, and the fluctuations in gas pressure inside the alkali vapor cell 6A can be reduced. In the method for producing the alkali vapor cell 6A according to the present embodiment, the simple substance of the alkali metal (alkali metal 68) is disposed. As compared with a case where a compound of an alkali metal is decomposed in the alkali vapor cell to obtain a simple substance of the alkali metal, the fluctuations in gas pressure in the alkali vapor cell 6A can be reduced. Thus, according to the method for producing the alkali vapor cell 6A, it is possible to produce the alkali vapor cell 6A with which efficient measurement can be made.

The step of disposing the alkali metal 68 includes a step of disposing the alkali metal 68 on the region R2 in a state where the second metal film 164 is covered with the mask. This can suppress the alkali metal 68 from adhering to the surface of the second metal film 164 when the alkali metal 68 is disposed.

Third Embodiment

[Configuration of Alkali Vapor Cell]

Figure 12:
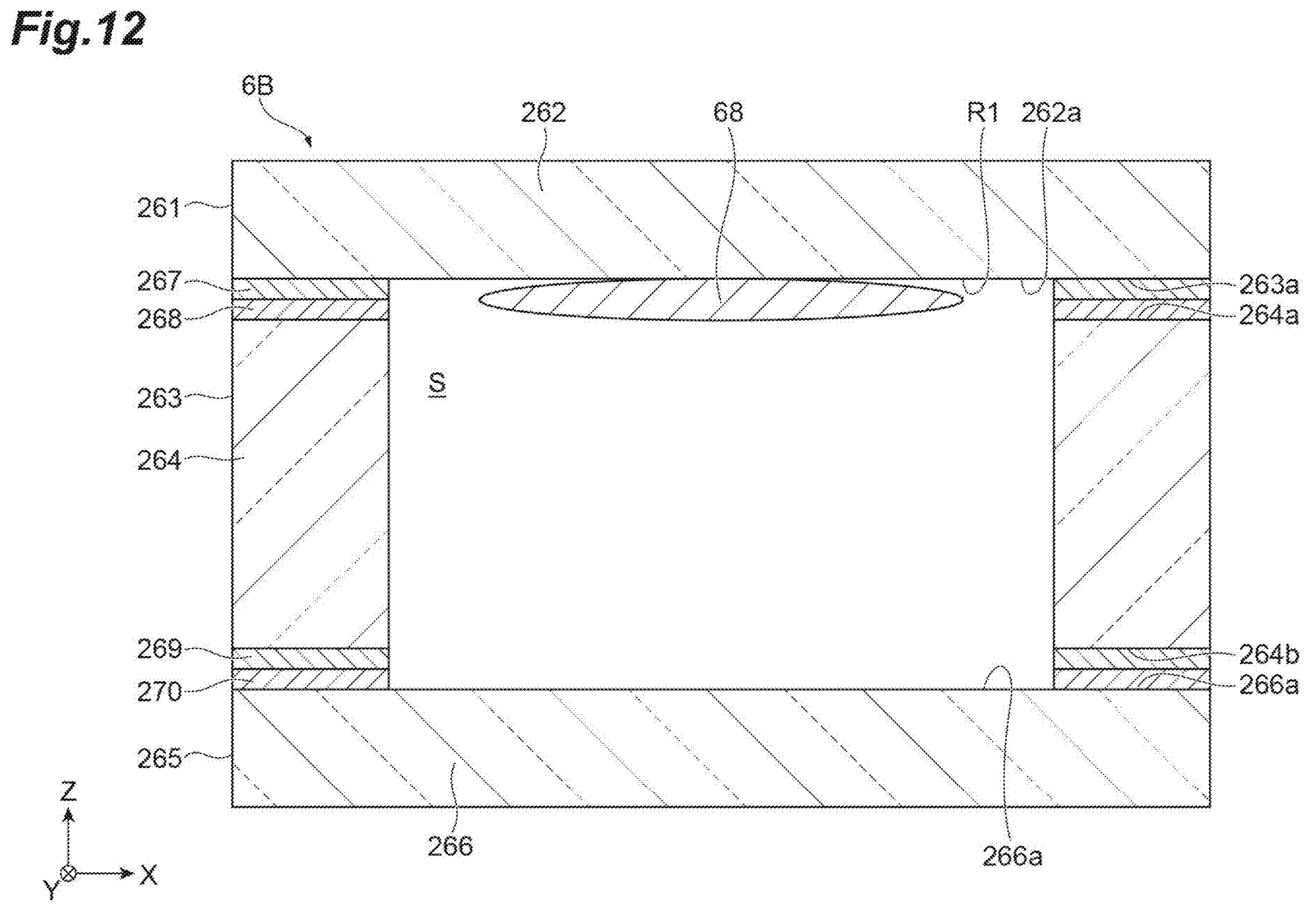

FIG. 12 is an enlarged cross-sectional view of an alkali vapor cell 6B according to the third embodiment. The alkali vapor cell 6B according to the present embodiment includes a first member 261, a second member 263, a third member 265, a first metal film 267, a second metal film 268, a third metal film 269, a fourth metal film 270, and an alkali metal 68.

The first member 261 includes a substrate portion 262. The substrate portion 262 is formed of, for example, an amorphous material having no crystal structure such as glass or a crystal material having a crystal structure such as silicon or sapphire. The substrate portion 262 has optical transparency. The substrate portion 262 is formed in a rectangular plate shape having a thickness along the Z-axis direction. The width of the substrate portion 262 along the X-axis direction and the width of the substrate portion 262 along the Y-axis direction are, for example, about 2 to 10 mm.

The second member 263 includes a frame portion 264. The frame portion 264 is configured separately from the substrate portion 262 of the first member 261. The frame portion 264 is disposed on one main surface 262a of the substrate portion 262 so as to extend along the outer edge of the substrate portion 262 as viewed from the Z-axis direction. As viewed from the Z-axis direction, the inner edge of the frame portion 264 has a circular shape, and the outer edge of the frame portion 264 has a rectangular shape. The frame portion 264 has a surface 264a facing the main surface 262a, and a surface 264b opposite to the surface 264a in the Z-axis direction. The surfaces 264a and 264b are flat surfaces extending perpendicular to the Z-axis direction. The frame portion 264 is formed of, for example, an amorphous material having no crystal structure such as glass or a crystal material having a crystal structure such as silicon or sapphire.

The third member 265 includes a substrate portion 266. The substrate portion 266 is formed of, for example, an amorphous material having no crystal structure such as glass or a crystal material having a crystal structure such as silicon or sapphire. The substrate portion 266 has optical transparency. The substrate portion 266 is formed in a rectangular plate shape having a thickness along the Z-axis direction. The width of the substrate portion 266 along the X-axis direction and the width of the substrate portion 266 along the Y-axis direction are, for example, about 2 to 10 mm. One main surface 266a of the substrate portion 266 faces the surface 264b of the frame portion 264.

The first metal film 267 is formed in a frame shape on the surface of the first member 261. In the present embodiment, the first metal film 267 is formed on the main surface 262a of the substrate portion 262. More specifically, the first metal film 267 is formed along the outer edge of the main surface 262a. The alkali vapor cell 6B further includes an adhesion layer and an anti-alloying layer located between the main surface 262a and the first metal film 267. The adhesion layer is formed on the main surface 262a and adheres to the main surface 262a. The anti-alloying layer is formed on the adhesion layer, and suppresses alloying between the material of the adhesion layer and the material of the first metal film 267. The adhesion layer and the anti-alloying layer located between the main surface 262a and the first metal film 267 may have the same material and thickness as those of the adhesion layer 91 and the anti-alloying layer 92.

The second metal film 268 is formed in a frame shape on the surface of the second member 263. In this example, the second metal film 268 is formed on the surface 264a of the frame portion 264. The alkali vapor cell 6B further includes an adhesion layer and an anti-alloying layer located between the surface 264a and the second metal film 268. The adhesion layer is formed on the surface 264a and adheres to the surface 264a. The anti-alloying layer is formed on the adhesion layer, and suppresses alloying between the material of the adhesion layer and the material of the second metal film 268. The adhesion layer and the anti-alloying layer located between the surface 264a and the second metal film 268 may have the same material and thickness as those of the adhesion layer 91 and the anti-alloying layer 92.

The third metal film 269 is formed in a frame shape on the surface of the second member 263. In this example, the third metal film 269 is formed on the surface 264b of the frame portion 264. The alkali vapor cell 6B further includes an adhesion layer and an anti-alloying layer located between the surface 264b and the third metal film 269. The adhesion layer is formed on the surface 264b and adheres to the surface 264b. The anti-alloying layer is formed on the adhesion layer, and suppresses alloying between the material of the adhesion layer and the material of the third metal film 269. The adhesion layer and the anti-alloying layer located between the surface 264b and the third metal film 269 may have the same material and thickness as those of the adhesion layer 91 and the anti-alloying layer 92.

The fourth metal film 270 is formed in a frame shape on the surface of the third member 265. In the present embodiment, the fourth metal film 270 is formed on the main surface 266a of the substrate portion 266. More specifically, the fourth metal film 270 is formed along the outer edge of the main surface 266a. The alkali vapor cell 6B further includes an adhesion layer and an anti-alloying layer located between the main surface 266a and the fourth metal film 270. The adhesion layer is formed on the main surface 266a and adheres to the main surface 266a. The anti-alloying layer is formed on the adhesion layer, and suppresses alloying between the material of the adhesion layer and the material of the fourth metal film 270. The adhesion layer and the anti-alloying layer located between the main surface 266a and the fourth metal film 270 may have the same material and thickness as those of the adhesion layer 91 and the anti-alloying layer 92.

The alkali metal 68 is disposed on a region (first region) R1 located inside the first metal film 267 on the surface of the first member 261. In this example, the region R1 is a region located inside the first metal film 267 on the main surface 262a of the substrate portion 262.

The second member 263 is disposed on the main surface 262a such that the surface 264a of the frame portion 264 faces the main surface 262a of the substrate portion 262. The frame portion 264 surrounds the space on the main surface 262a. The second member 263 is disposed such that the first metal film 267 and the second metal film 268 are in contact with each other. The first metal film 267 and the second metal film 268 are directly bonded to each other. The third member 265 is disposed on the surface 264b such that the main surface 266a of the substrate portion 266 faces the surface 264b of the frame portion 264. The third member 265 is disposed such that the third metal film 269 and the fourth metal film 270 are in contact with each other. The third metal film 269 and the fourth metal film 270 are directly bonded to each other.

Since the first metal film 267 and the second metal film 268 are bonded to each other and the third metal film 269 and the fourth metal film 270 are bonded to each other, a space defined by the first member 261, the second member 263, and the third member 265 (space surrounded by the frame portion 264) is hermetically sealed. The alkali metal 68 and a buffer gas are enclosed in the space defined by the first member 261, the second member 263, and the third member 265.

[Method for Producing Alkali Vapor Cell]

A method for producing the alkali vapor cell 6B is described. First, the first member 261, the second member 263, and the third member 265 are prepared. Subsequently, the first metal film 267 is formed in a frame shape on the surface of the first member 261. In the present embodiment, the first metal film 267 is indirectly formed on the main surface 262a of the substrate portion 262 via the adhesion layer and the anti-alloying layer. Specifically, first, the main surface 262a of the substrate portion 262 is flattened by polishing, and then the surface of the first member 261 is cleaned by ultrasonic cleaning. The adhesion layer and the anti-alloying layer are formed on the main surface 262a by the same method as the method for forming the adhesion layer 91 and the anti-alloying layer 92.

Subsequently, the first metal film 267 is formed on the anti-alloying layer. The first metal film 267 is formed by, for example, sputtering (EB vapor deposition, resistance heating vapor deposition). The first metal film 267 is formed so as to have a thickness of 100 nm or less. In addition, the first metal film 267 is formed so that the surface roughness Ra of the first metal film 267 after the film formation is 1.5 nm or less. Subsequently, the surface of the first metal film 267 is cleaned by plasma treatment.

The second metal film 268 and the third metal film 269 are formed in a frame shape on the surface of the second member 263. In the present embodiment, the second metal film 268 is indirectly formed on the surface 264a of the frame portion 264 via the adhesion layer and the anti-alloying layer, and the third metal film 269 is indirectly formed on the surface 264b of the frame portion 264 via the adhesion layer and the anti-alloying layer. Specifically, first, the surfaces 264a and 264b of the frame portion 264 are flattened by polishing, and then the surface of the second member 263 is cleaned by ultrasonic cleaning. Then, the adhesion layer and the anti-alloying layer are formed on the surfaces 264a and 264b by the same method as the method for forming the adhesion layer 91 and the anti-alloying layer 92.

Subsequently, the second metal film 268 is formed on the anti-alloying layer on the surface 264a, and the third metal film 269 is formed on the anti-alloying layer on the surface 264b. The second metal film 268 and the third metal film 269 are formed by, for example, sputtering (EB vapor deposition, resistance heating vapor deposition). The second metal film 268 and the third metal film 269 are formed so as to have a thickness of 100 nm or less. In addition, the second metal film 268 and the third metal film 269 are formed so that the surface roughness Ra of each of the second metal film 268 and the third metal film 269 after the film formation is 1.5 nm or less. Subsequently, the surfaces of the second metal film 268 and the third metal film 269 are cleaned by plasma treatment.

The fourth metal film 270 is formed in a frame shape on the surface of the third member 265. In the present embodiment, the fourth metal film 270 is indirectly formed on the main surface 266a of the substrate portion 266 via the adhesion layer and the anti-alloying layer. Specifically, first, the main surface 266a of the substrate portion 266 is flattened by polishing, and then the surface of the third member 265 is cleaned by ultrasonic cleaning. The adhesion layer and the anti-alloying layer are formed on the main surface 266a by the same method as the method for forming the adhesion layer 91 and the anti-alloying layer 92.

Subsequently, the fourth metal film 270 is formed on the anti-alloying layer. The fourth metal film 270 is formed by, for example, sputtering (EB vapor deposition, resistance heating vapor deposition). The fourth metal film 270 is formed so as to have a thickness of 100 nm or less. In addition, the fourth metal film 270 is formed so that the surface roughness Ra of the fourth metal film 270 after the film formation is 1.5 nm or less. Subsequently, the surface of the fourth metal film 270 is cleaned by plasma treatment.

Subsequently, the alkali metal 68 is disposed on the region R1 of the first member 261. At this time, in a state where the first metal film 267 is covered with a mask (first mask), the alkali metal 68 is disposed on the region R1. In the present embodiment, a film made of a simple substance of an alkali metal is formed on the main surface 262a of the substrate portion 262 by vapor deposition. After the alkali metal 68 is disposed, the mask is removed from the first member 261.

Then, the second member 263 is disposed on the first member 261 such that the first metal film 267 and the second metal film 268 are in contact with each other. In the present embodiment, the second member 263 is disposed on the main surface 262a.

Subsequently, the first metal film 267 and the second metal film 268 are directly bonded to each other in a normal temperature environment. In the present embodiment, the first metal film 267 and the second metal film 268 are directly bonded to each other in a state where pressure in a direction to bring the first member 261 and the second member 263 close to each other is applied to the first member 261 and the second member 263. Subsequently, a buffer gas is introduced into the space surrounded by the frame portion 264.

Then, the third member 265 is disposed on the second member 263 such that the third metal film 269 and the fourth metal film 270 are in contact with each other. In the present embodiment, the third member 265 is disposed on the surface 264b such that the main surface 266a of the substrate portion 266 faces the main surface 262a of the substrate portion 262.

Subsequently, the third metal film 269 and the fourth metal film 270 are directly bonded to each other in a normal temperature environment. In the present embodiment, the third metal film 269 and the fourth metal film 270 are directly bonded to each other in a state where pressure in a direction to bring the second member 263 and the third member 265 close to each other is applied to the second member 263 and the third member 265. Thus, the alkali vapor cell 6B is obtained.

As with the first embodiment, in the method for producing the alkali vapor cell 6B according to the present embodiment, the first metal film 267 and the second metal film 268 are formed so that the thickness of each of the first metal film 267 and the second metal film 268 is 100 nm or less. Therefore, the first metal film 267 and the second metal film 268 can be directly bonded to each other in a normal temperature environment, and the fluctuations in gas pressure inside the alkali vapor cell 6B can be reduced. In the method for producing the alkali vapor cell 6B according to the present embodiment, the simple substance of the alkali metal (alkali metal 68) is disposed. As compared with a case where a compound of an alkali metal is decomposed in the alkali vapor cell to obtain a simple substance of the alkali metal, the fluctuations in gas pressure in the alkali vapor cell 6B can be reduced. Thus, according to the method for producing the alkali vapor cell 6B, it is possible to produce the alkali vapor cell 6B with which efficient measurement can be made.

[Modifications]

The present disclosure is not limited to the above embodiments. In the step of disposing the simple substance of the alkali metal, the simple substance of the alkali metal may be disposed on at least a partial region of the surface of the first member and the surface of the second member. Specifically, the simple substance of the alkali metal may be disposed only on at least a partial region of the surface of the first member, the simple substance of the alkali metal may be disposed only on at least a partial region of the surface of the second member, or the simple substance of the alkali metal may be disposed on both regions of at least a partial region of the surface of the first member and at least a partial region of the surface of the second member. For example, in each of the embodiments described above, the simple substance of the alkali metal may be disposed on at least one of the first region located inside the first metal film on the surface of the first member and the second region located inside the second metal film on the surface of the second member. Specifically, for example, in the first embodiment, the alkali metal 68 may be disposed on the region (second region) R2 located inside the second metal film 67 on the surface of the second member 64 without disposing the alkali metal 68 on the region R1 of the first member 61 illustrated in FIG. 2. The alkali metal 68 may be disposed on both the region R1 of the first member 61 and the region R2 of the second member 64. The alkali metal 68 may be disposed on a region constituting the inner peripheral surface 63b of the frame portion 63.

In the step of disposing the alkali metal 68, the first metal film 66 or the second metal film 67 does not have to be covered with the mask 100. The mask 100 may be formed of a material other than a metal. The thickness of the mask 100 may be 0.5 mm or less, or may be 1 mm or more. At least any one of the adhesion layers 91 and 93 and the anti-alloying layers 92 and 94 may be omitted.

In the step of directly bonding the first metal film 66 and the second metal film 67 to each other, the pressure applied to the first member 61 and the second member 64 may be 125 kgf/42 mm$^2$ or less, or 125 kgf/32 mm$^2$ or more (30 N/mm$^2$ or less, or 40 N/mm$^2$ or more). The first metal film 66 and the second metal film 67 may be directly bonded to each other without applying pressure to the first member 61 and the second member 64.

In the first embodiment, it is sufficient that the substrate portions 62 and 65 through which light from the light source 2 passes have optical transparency, and the frame portion 63 does not have to have optical transparency. In this case, the frame portion 63 may be formed of a material different from that of the substrate portion 62. Similarly, in the second embodiment, it is sufficient that the substrate portions 62 and 162 have optical transparency, and the frame portions 63 and 163 do not have to have optical transparency. In this case, each of the frame portions 63 and 163 may be formed of a material different from the material of the substrate portions 62 and 162. Similarly, in the third embodiment, it is sufficient that the substrate portions 262 and 266 have optical transparency, and the frame portion 264 does not have to have optical transparency. In this case, the frame portion 264 may be formed of a material different from the material of the substrate portions 262 and 266.

The first metal film, the second metal film, the third metal film, and the fourth metal film may not be formed in a frame shape. For example, in the first embodiment, the second metal film 67 may be formed on the entire main surface 65a of the substrate portion 65. In this case, the frame portion 63 may have optical transparency, and light from the light source 2 may pass through the frame portion 63 to enter into the alkali vapor cell 6. As another example, in the third embodiment, the first metal film 267 may be formed on the entire main surface 262a of the substrate portion 262, and the fourth metal film 270 may be formed on the entire main surface 266a of the substrate portion 266. In this case, the frame portion 264 may have optical transparency, and light from the light source 2 may pass through the frame portion 264 to enter into the alkali vapor cell 6B.

The alkali vapor cell 6 may include a plurality of alkali metals 68. The plurality of alkali metals 68 may contain simple substances of two or more kinds of alkali metals. Two or more kinds of buffer gases may be enclosed in the alkali vapor cell 6.

What is claimed is:

1. A method for producing an alkali vapor cell comprising:

a step of preparing a first member and a second member constituting at least a part of a container for enclosing an alkali metal;

a step of forming a first metal film on a surface of the first member;

a step of forming a second metal film on a surface of the second member;

a step of disposing a simple substance of the alkali metal on at least a partial region of the surface of the first member and the surface of the second member; and a step of directly bonding the first metal film and the second metal film to each other in a normal temperature environment, wherein in the step of forming the first metal film, the first metal film is formed so that a thickness of the first metal film is 100 nm or less, in the step of forming the second metal film, the second metal film is formed so that a thickness of the second metal film is 100 nm or less, and the step of disposing the simple substance of the alkali metal includes at least one of a step of disposing the simple substance of the alkali metal on at least a partial region of the surface of the first member in a state where the first metal film is covered with a first mask, and a step of disposing the simple substance of the alkali metal on at least a partial region of the surface of the second member in a state where the second metal film is covered with a second mask.

2. The method for producing an alkali vapor cell according to claim 1, wherein in the step of forming the first metal film, the first metal film is formed in a frame shape, in the step of forming the second metal film, the second metal film is formed in a frame shape, and in the step of disposing the simple substance of the alkali metal, the simple substance of the alkali metal is disposed on at least one of a first region located inside the first metal film on the surface of the first member and a second region located inside the second metal film on the surface of the second member.

3. The method for producing an alkali vapor cell according to claim 1, wherein in the step of forming the first metal film, the first metal film is formed of gold, and in the step of forming the second metal film, the second metal film is formed of gold.

4. The method for producing an alkali vapor cell according to claim 1, wherein each of the first mask and the second mask is formed of a metal and has a thickness of 0.5 mm or more and 1 mm or less.

5. The method for producing an alkali vapor cell according to claim 1, wherein in the step of forming the first metal film, a first layer is formed of chromium on the surface of the first member, a second layer is formed of platinum or nickel on the first layer, and the first metal film is formed on the second layer.

6. The method for producing an alkali vapor cell according to claim 1, wherein in the step of forming the second metal film, a third layer is formed of chromium on the surface of the second member, a fourth layer is formed of platinum or nickel on the third layer, and the second metal film is formed on the fourth layer.

7. The method for producing an alkali vapor cell according to claim 1, further comprising a step of cleaning a surface of the first metal film by plasma treatment.

8. The method for producing an alkali vapor cell according to claim 1, further comprising a step of cleaning a surface of the second metal film by plasma treatment.

9. The method for producing an alkali vapor cell according to claim 1, wherein in the step of forming the first metal film, the first metal film is formed so that surface roughness of the first metal film is 1.5 nm or less.

10. The method for producing an alkali vapor cell according to claim 1, wherein in the step of forming the second metal film, the second metal film is formed so that surface roughness of the second metal film is 1.5 nm or less.

11. The method for producing an alkali vapor cell according to claim 1, wherein in the step of directly bonding the first metal film and the second metal film to each other, the first metal film and the second metal film are directly bonded to each other in a state where pressure in a direction to bring the first member and the second member close to each other is applied to the first member and the second member.

12. The method for producing an alkali vapor cell according to claim 1, wherein the first member includes a first substrate portion having optical transparency and a frame portion that is formed on a main surface of the first substrate portion and surrounds a space on the main surface, the second member includes a second substrate portion having optical transparency, in the step of forming the first metal film, the first metal film is formed on a surface of the frame portion, in the step of forming the second metal film, the second metal film is formed on a main surface of the second substrate portion, and in the step of directly bonding the first metal film and the second metal film to each other, the second member is disposed on the frame portion, and the first metal film and the second metal film are directly bonded to each other so as to hermetically seal the space.

13. A method for producing an alkali vapor cell comprising:

a step of preparing a first member and a second member constituting at least a part of a container for enclosing an alkali metal;

a step of forming a first metal film on a surface of the first member;

a step of forming a second metal film on a surface of the second member;

a step of disposing a simple substance of the alkali metal on at least a partial region of the surface of the first member and the surface of the second member; and a step of directly bonding the first metal film and the second metal film to each other in a normal temperature environment, wherein in the step of forming the first metal film, the first metal film is formed so that a thickness of the first metal film is 100 nm or less, in the step of forming the second metal film, the second metal film is formed so that a thickness of the second metal film is 100 nm or less, and in the step of forming the first metal film, a first layer is formed of chromium on the surface of the first member, a second layer is formed of platinum or nickel on the first layer, and the first metal film is formed on the second layer.

14. A method for producing an alkali vapor cell comprising:

a step of preparing a first member and a second member constituting at least a part of a container for enclosing an alkali metal;

a step of forming a first metal film on a surface of the first member;

a step of forming a second metal film on a surface of the second member;

a step of disposing a simple substance of the alkali metal on at least a partial region of the surface of the first member and the surface of the second member; and a step of directly bonding the first metal film and the second metal film to each other in a normal temperature environment, wherein in the step of forming the first metal film, the first metal film is formed so that a thickness of the first metal film is 100 nm or less, in the step of forming the second metal film, the second metal film is formed so that a thickness of the second metal film is 100 nm or less, and in the step of forming the second metal film, a third layer is formed of chromium on the surface of the second member, a fourth layer is formed of platinum or nickel on the third layer, and the second metal film is formed on the fourth layer.

* * * * *